United States Patent
Rawat et al.

(10) Patent No.: US 12,361,982 B2
(45) Date of Patent: Jul. 15, 2025

(54) MEMORY ARCHITECTURE SUPPORTING BOTH CONVENTIONAL MEMORY ACCESS MODE AND DIGITAL IN-MEMORY COMPUTATION PROCESSING MODE

(71) Applicant: STMicroelectronics International N.V., Geneva (CH)

(72) Inventors: Harsh Rawat, Haryana (IN); Nitin Chawla, Noida (IN); Promod Kumar, Greater Noida (IN); Kedar Janardan Dhori, Ghaziabad (IN); Manuj Ayodhyawasi, Noida (IN)

(73) Assignee: STMicroelectronics International N.V., Geneva (CH)

( * ) Notice: Subject to any disclaimer, the term of this patent is extended or adjusted under 35 U.S.C. 154(b) by 113 days.

(21) Appl. No.: 18/233,562

(22) Filed: Aug. 14, 2023

(65) Prior Publication Data

US 2024/0071429 A1    Feb. 29, 2024

Related U.S. Application Data

(60) Provisional application No. 63/402,208, filed on Aug. 30, 2022.

(51) Int. Cl.
*G11C 7/10* (2006.01)
*G11C 7/12* (2006.01)

(52) U.S. Cl.
CPC .......... *G11C 7/1009* (2013.01); *G11C 7/1057* (2013.01); *G11C 7/106* (2013.01);
(Continued)

(58) Field of Classification Search
CPC ..... G11C 7/1009; G11C 7/1057; G11C 7/106; G11C 7/1087; G11C 7/109; G11C 7/1096; G11C 7/12
See application file for complete search history.

(56) References Cited

U.S. PATENT DOCUMENTS 5,530,824 A    6/1996  Peng et al.
6,816,408 B2  11/2004  Blodgett
(Continued)

OTHER PUBLICATIONS

Agrawal et al., "Xcel-RAM: Accelerating Binary Neural Networks in High-Throughput SRAM Compute Arrays" arXiv:1807.00343v2, 10 pages.

(Continued)

*Primary Examiner* — Han Yang
(74) *Attorney, Agent, or Firm* — Crowe & Dunlevy

(57) ABSTRACT

The memory array of a circuit includes sub-arrays with memory cells arranged in a row-column matrix where each row includes a word line and each sub-array column includes a local bit line. A control circuit supports two modes of circuit operation: a first mode where only one word line in the memory array is actuated during a memory read and a second mode where one word line per sub-array are simultaneously actuated during the memory read. An input/output circuit for each column includes inputs to the local bit lines of the sub-arrays, a column data output coupled to the bit line inputs, and a sub-array data output coupled to each bit line input. In memory computation operations are performed in the second mode as a function of feature data and weight data stored in the memory.

19 Claims, 12 Drawing Sheets

(52) U.S. Cl.
CPC .......... *G11C 7/1087* (2013.01); *G11C 7/109* (2013.01); *G11C 7/1096* (2013.01); *G11C 7/12* (2013.01)

(56) References Cited

U.S. PATENT DOCUMENTS

| 6,909,663 | B1 | 6/2005 | Vernenker et al. |
|---|---|---|---|
| 9,007,848 | B2 | 4/2015 | Feki |
| 10,210,935 | B2 | 2/2019 | Akerib et al. |
| 10,565,138 | B2 | 2/2020 | Kavalieros et al. |
| 10,748,603 | B2 | 8/2020 | Sumbul et al. |
| 11,474,788 | B2 | 10/2022 | Chawla et al. |
| 2015/0309743 | A1 | 10/2015 | Sohn et al. |
| 2019/0205095 | A1 | 7/2019 | Gupta et al. |
| 2020/0126178 | A1 | 4/2020 | Munteanu et al. |
| 2020/0160157 | A1 | 5/2020 | Kim et al. |
| 2020/0174786 | A1* | 6/2020 | Zhang ............... G06F 17/13 |
| 2020/0258890 | A1* | 8/2020 | Augustine .......... H10B 10/00 |
| 2023/0102492 | A1 | 3/2023 | Rawat et al. |

OTHER PUBLICATIONS

Agrawal, Amogh, et al: X-SRAM: Enabling In-Memory Boolean Computations in CMOS Static Random Access Memories, IEEE Transactions on Circuits and Systems-I: Regular Papers, vol. 65, No. 12, Dec. 2018.
Biswas, Avishek, et al: CONF-SRAM: An Energy-Efficient SRAM With In-Memory Dot-Product Computation for Low-Power Convolution for Low-Power Convolutional Neural Networks, IEEE Journal of Solid-State Circuits, vol. 54, No. 1, Jan. 2019.
Dong, Qing, et al: A 351TOPS/W and 372.4GOPS Compute-in-Memory SRAM Macro in 6nm FinFET CMOS for Machine-Learning Applications, ISSCC 2020, Session 15, SRAM & Compute-in-Memory, 15.3.
H. Jia et al., 15.1 A Programmable Neural-Network Inference Accelerator Based on Scalable In-Memory Computing, 2021 IEEE International Solid- State Circuits Conference (ISSCC), 2021, pp. 236-238, doi: 10.1109/ISSCC42613.2021.9365788.
H. Jia et al., Scalable and Programmable Neural Network Inference Accelerator Based on In-Memory Computing, in IEEE Journal of Solid-State Circuits, vol. 57, No. 1, pp. 198-211, Jan. 2022, doi: 10.1109/JSSC.2021.3119018.
J.-W. Su et al., 16.3 A 28nm 384kb 6T-SRAM Computation-in-Memory Macro with 8b Precision for AI Edge Chips, 2021 IEEE International Solid-State Circuits Conference (ISSCC), 2021, pp. 250-252, doi: 10.1109/ISSCC42613.2021.9365984.
J. Lee, H. Valavi, Y. Tang and N. Verma, Fully Row/Column Parallel In-memory Computing SRAM Macro employing Capacitor-based Mixed-signal Computation with 5-b Inputs, 2021 Symposium on VLSI Circuits, 2021, pp. 1-2, doi: 10.23919/VLSICircuits52068.2021.9492444.
Jia, Hongyang, et al: A Programmable Heterogeneous Microprocessor Based on Bit-Scalable In-Memory Computing, IEEE Journal of Solid-State Circuits, vol. 55, No. 9, Sep. 2020.
Jiang, Zhewei, et al: C3SRAM: An In-Memory-Computing SRAM Macro Based on Robust Capacitive Coupling Computing Mechanism, IEEE Journal of Solid-State Circuits, vol. 55, No. 7, Jul. 2020.
Kang, Mingu, et al: A Multi-Functional In-Memory Inference Processor Using a Standard 6T SRAM Array, IEEE Journal of Solid-State Circuits, vol. 53, No. 2, Feb. 2018.
Si, Xin, et al.: A 28nm 64Kb 6T SRAM Computing-in-Memory Macro with 8b MAC Operation for AI Edge Chips, ISSCC 2020, Session 15, SRAM & Compute-in-Memorya, 15.5.
Si, Xin, et al: A Twin-8T SRAM Computation-In-Memory Macro for Multipe-Bit CNN-Based Machine Learning, ISSCC 2019, Session 24, SRAM & Computation-in-Memory, 24.5.
Su, Jian-Wei, et al: A 28nm 64Kb Inference-Taining Two-Way Transpose Multibit 6T SRAM Compute-in-Memory Macro for AI Edge Chips, ISSCC 2020, Session 15, SRAM & Compute-in-Memory, 15.2.
V. K. Rajanna, S. Taneja and M. Alioto, SRAM with In-Memory Inference and 90% Bitline Activity Reduction for Always-On Sensing with 109 TOPS/mm2 and 749-1,459 TOPS/W in 28nm, ESSDERC 2021—IEEE 51st European Solid-State Device Research Conference (ESSDERC), 2021, pp. 127-130, doi: 10.1109/ESSDERC53440.2021.9631782.
Valavi, Hossein, et al: A 64-Tile 2.4-Mb In-Memory-Computing CNN Accelerator Employing Charge-Domain Compute, IEEE Journal of Solid-State Circuits, vol. 54, No. 6, Jun. 2019.
Verma, Naveen, et al.: "In-Memory Computing Advances and Prospects," IEEE Solid-State Circuits Magazine, Summer 2019, pp. 43-55.
Y.-D. Chih et al., 16.4 An 89TOPS/W and 16.3TOPS/mm2 All-Digital SRAM-Based Full-Precision Compute-In Memory Macro in 22nm for Machine-Learning Edge Applications, 2021 IEEE International Solid-State Circuits Conference (ISSCC), 2021, pp. 252-254, doi: 10.1109/ISSCC42613.2021.9365766.
Yin, Shihui, et al: XNOR-SRAM: In-Memory Computing SRAM Macro for Binary/Ternary Deep Neural Networks, IEEE Journal of So.id-State Circuits, vol. 55, No. 6, Jun. 2020.
Z. Chen, X. Chen and J. Gu, 15.3 A 65nm 3T Dynamic Analog RAM-Based Computing-in-Memory Macro and CNN Accelerator with Retention Enhancement, Adaptive Analog Sparsity and 44TOPS/W System Energy Efficiency, 2021 IEEE International Solid-State Circuits Conference (ISSCC), 2021, pp. 240-242, doi: 10.1109/ISSCC42613.2021.9366045.
Yu, Chengshuo, et al.: "A Zero-Skipping Reconfigurable SRAM In-Memory Computing Macro with Binary-Searching ADC," ESSCIRC, 2021, 4 pgs.
Zhang, Jintao et al.: "An In-memory-Computing DNN Achieving 700 TOPS/W and 6 TOPS/mm$^2$ in 130-nm CMOS," IEEE Journal on Emerging and Selected Topics in Circuits and Systems, 2019, 9 pgs.
Zhang, Jintao, et al: In-Memory Computation of a Machine-Learning Classifier in a Standard 6T SRAM Array, IEEE Journal of Solid-State Circuits, vol. 52, No. 4, Apr. 2017.
Kim, Jinseok, et al: Area-Efficient and Variation-Tolerant In-Memory BNN Computing using 6T SRAM Array, 2019 Symposium on VLSI Circuits Digest of Technical Papers.

* cited by examiner

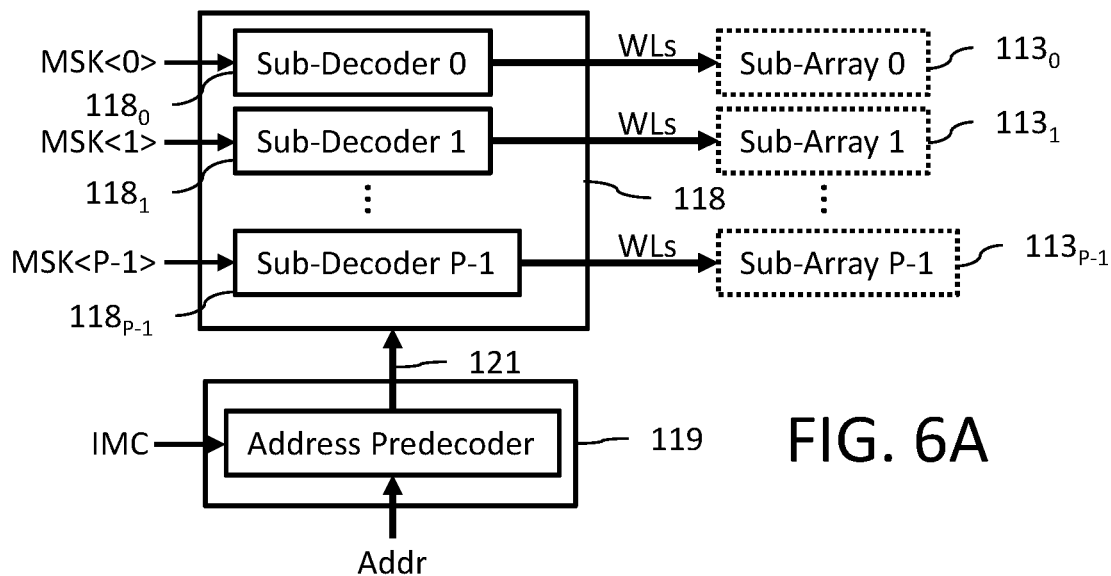
FIG. 6A
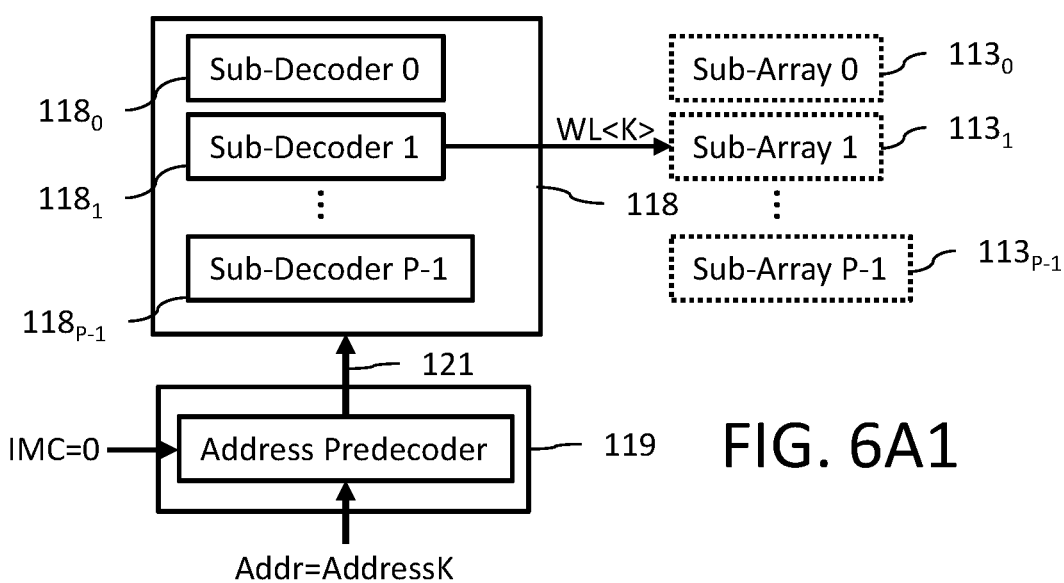
FIG. 6A1

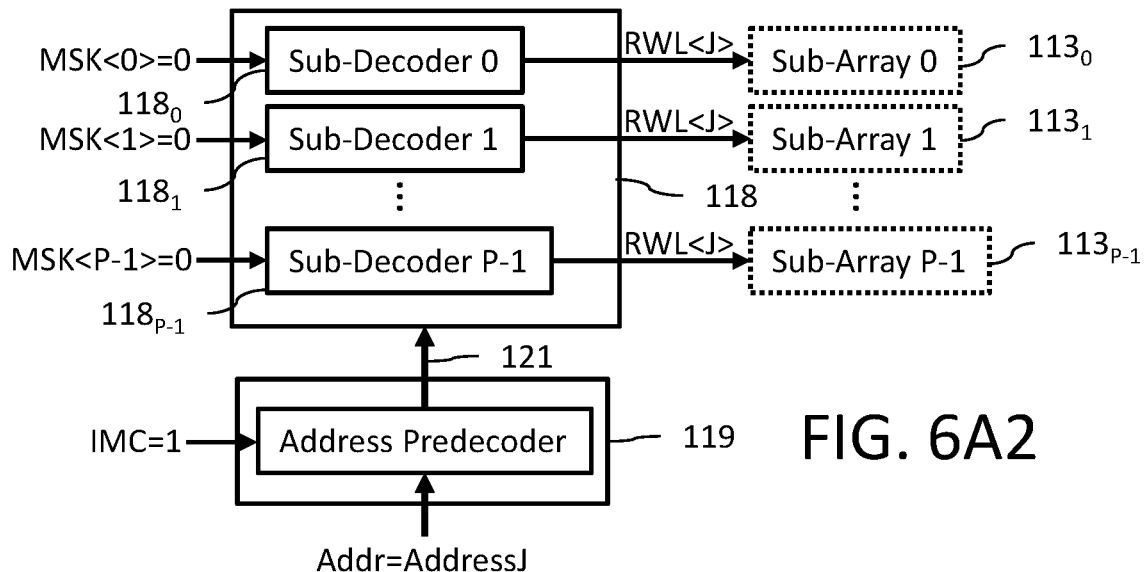
FIG. 6A2
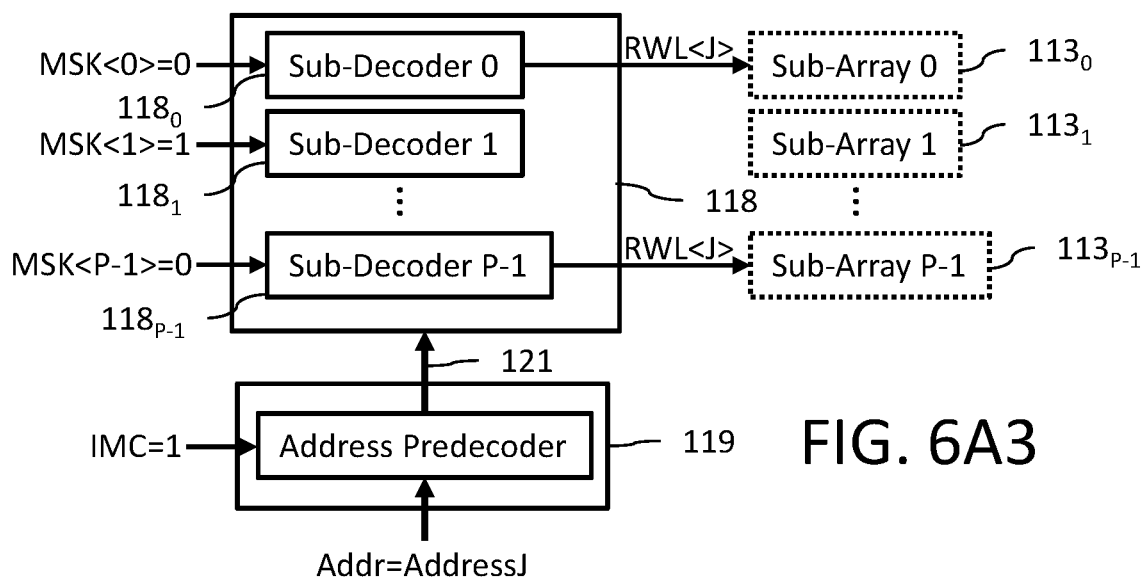
FIG. 6A3

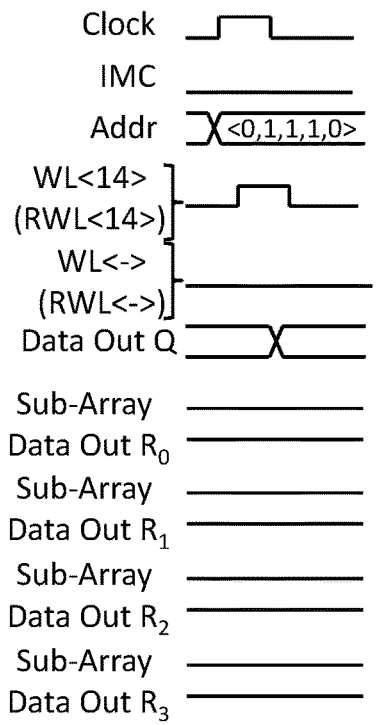
FIG. 6A4
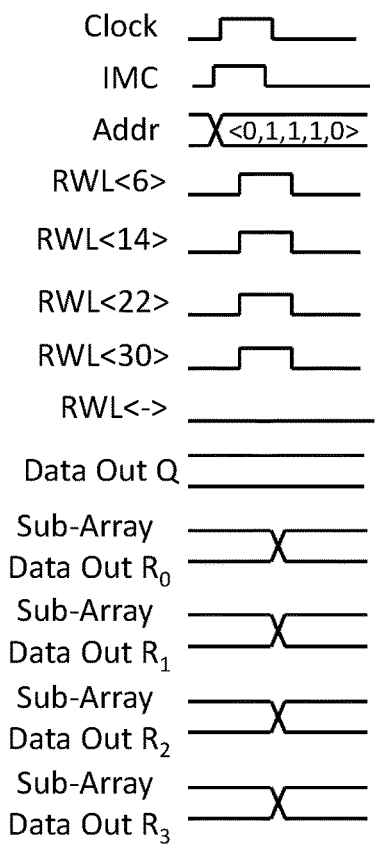
FIG. 6A5
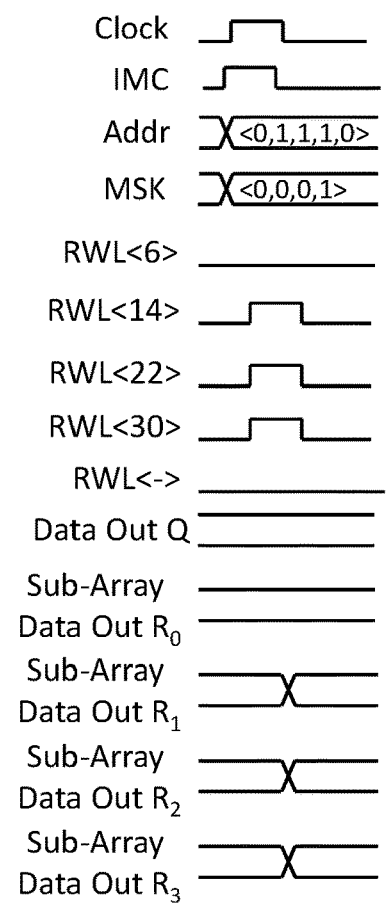
FIG. 6A6

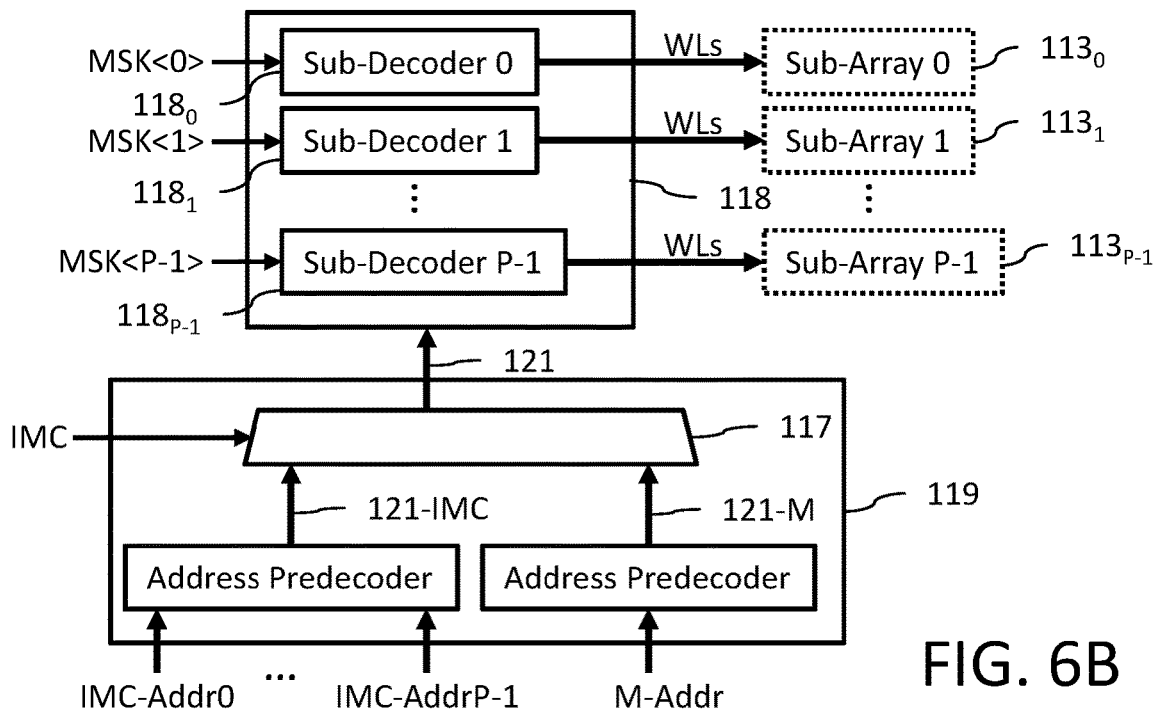
FIG. 6B
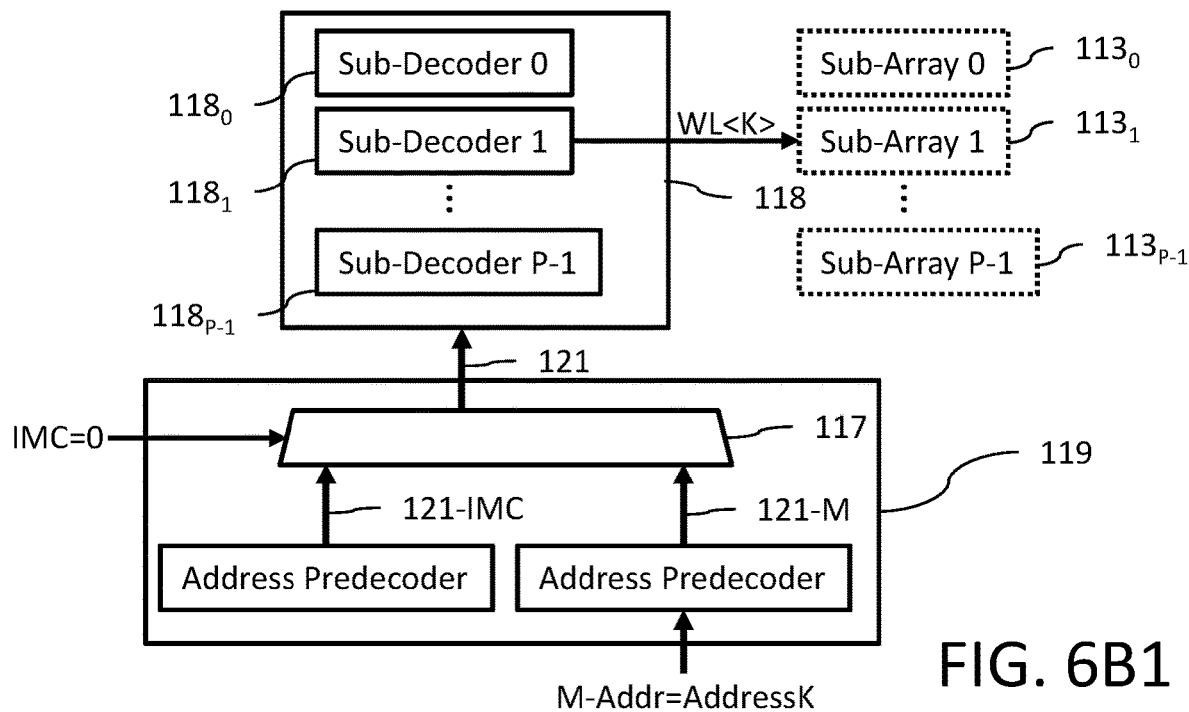
FIG. 6B1

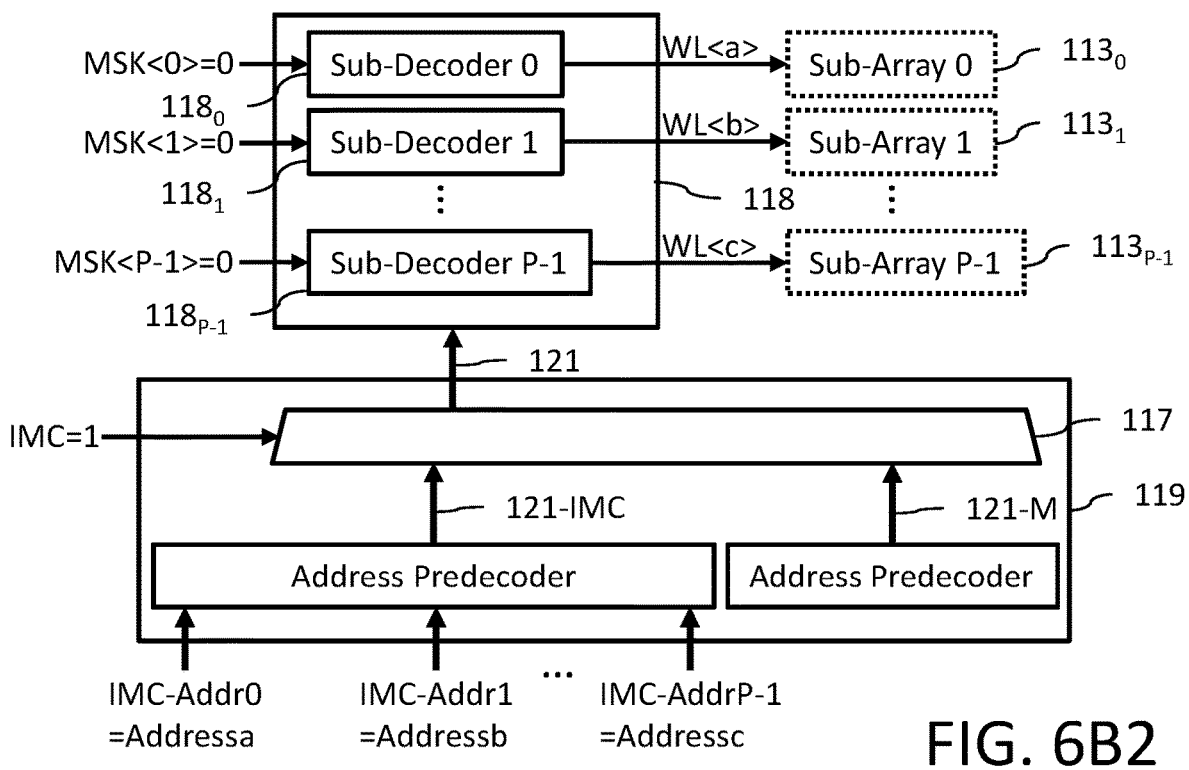
FIG. 6B2
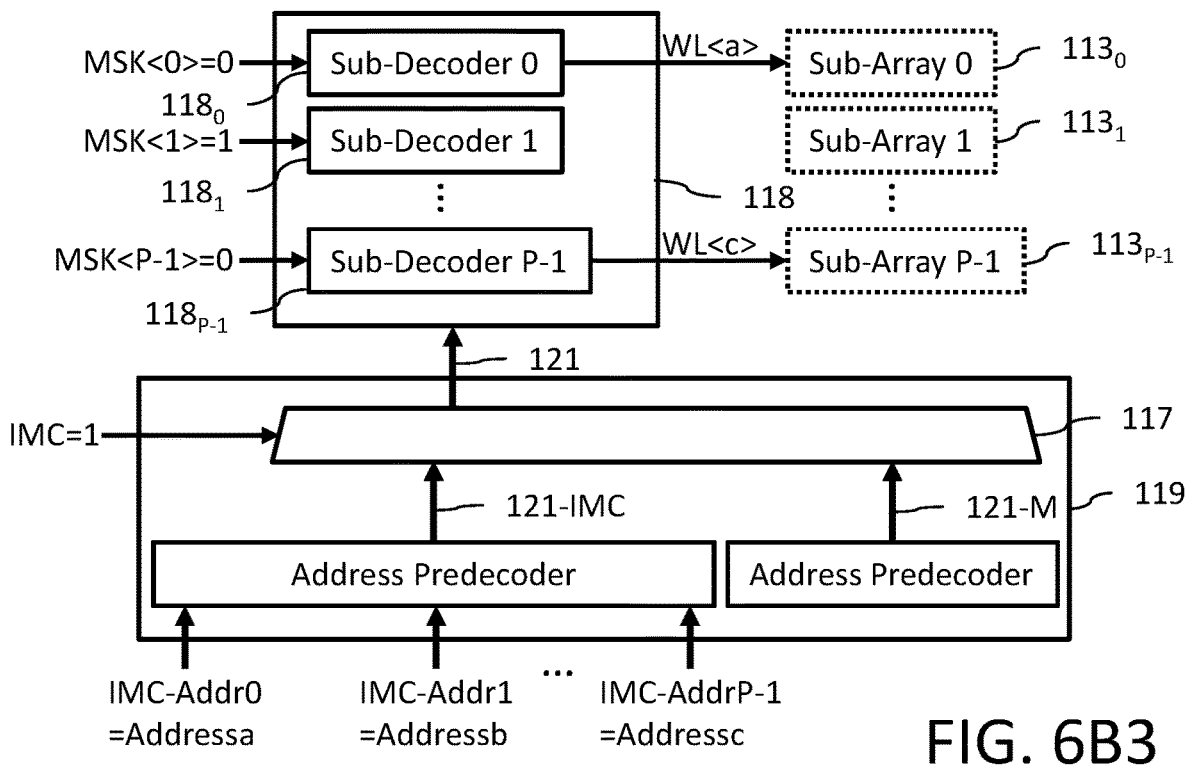
FIG. 6B3

MEMORY ARCHITECTURE SUPPORTING BOTH CONVENTIONAL MEMORY ACCESS MODE AND DIGITAL IN-MEMORY COMPUTATION PROCESSING MODE

CROSS REFERENCE TO RELATED APPLICATIONS

This application claims priority to U.S. Provisional Application for Patent No. 63/402,208, filed Aug. 30, 2022, the disclosure of which is incorporated by reference.

TECHNICAL FIELD

Embodiments herein relate to a memory architecture and, in particular, to memory support of both conventional memory access mode and digital in-memory computation processing mode.

BACKGROUND

Reference is made to FIG. 1 which shows a schematic diagram of an analog in-memory computation circuit 10. The circuit 10 utilizes a memory circuit including a static random access memory (SRAM) array 12 formed by standard 6T SRAM memory cells 14 arranged in a matrix format having N rows and M columns. As an alternative, a standard 8T memory cell or an SRAM with a similar functionality and topology could instead be used. Each memory cell 14 is programmed to store a bit of a computational weight or kernel data for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line RBL. The cells 14 in a common row of the matrix are connected to each other through a common word line WL (and through the common read word line RWL in the 8T-type implementation). The cells 14 in a common column of the matrix are connected to each other through a common pair of complementary bit lines BLT and BLC (and through the common read bit line RBL in the 8T-type implementation). Each word line WL, RWL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit and controlled by a row controller circuit 18. A column processing circuit 20 senses the analog signals on the pairs of complementary bit lines BLT and BLC (and/or on the read bit line RBL) for the M columns, converts the analog signals to digital signals, performs digital calculations on the digital signals and generates a decision output for the in-memory compute operation.

Although not explicitly shown in FIG. 1, it will be understood that the circuit 10 further includes conventional row decode, column decode, and read-write circuits known to those skilled in the art for use in connection with writing bits of data (for example, the computational weight data) to, and reading bits of data from, the SRAM cells 14 of the memory array 12. This operation is referred to as a conventional memory access mode and is distinguished from the analog in-memory compute operation discussed above.

The row controller circuit 18 receives the feature data for the in-memory compute operation and in response thereto performs the function of selecting which ones of the word lines WL<0> to WL<N−1> (or read word lines RWL<0> to RWL<N−1>) are to be simultaneously accessed (or actuated) in parallel during an analog in-memory compute operation, and further functions to control application of pulsed signals to the word lines in accordance with that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signals on a given pair of complementary bit lines BLT and BLC (or analog signal on the read bit line RBL in the 8T-type implementation) are dependent on the logic state of the bits of the computational weight stored in the memory cells 14 of the corresponding column and the width(s) of the pulsed word line signals applied to those memory cells 14.

The implementation illustrated in FIG. 1 shows an example in the form of a pulse width modulation (PWM) for the applied word line signals for the in-memory compute operation dependent on the received feature data. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines. Furthermore, in a simpler implementation, it will be understood that all applied word line signals in the simultaneous actuation may instead have a same pulse width.

There exist a number of concerns with analog in-memory compute operations including: the parallel simultaneous word line access to the memory can lead to inadvertent bit flip which disturbs the logic state of the stored weight data; the multiply and accumulate (MAC) operation is in the form of analog signal levels on a shared signal line with analog-to-digital conversion; the computation is by nature an approximation due to analog signal level variation; and the circuit arrangement is complex and testability is a challenge. The analog in-memory computation solution is therefore not acceptable for applications needing deterministic computations such as in safety or security. It would be preferred to perform a digital or predictable computation.

SUMMARY

A circuit includes: a memory array including a plurality of sub-arrays, wherein each sub-array includes memory cells arranged in a matrix with plural rows and plural columns, each row including a word line connected to the memory cells of the row, and each column including a local bit line connected to the memory cells of the column; a word line drive circuit for each row having an output connected to drive the word line of the row; and a row decoder circuit coupled to the word line drive circuits.

A control circuit is configured to support two modes of memory circuit operation including: a first mode where the row decoder circuit actuates only one word line in the memory array during a memory access operation and a second mode where the row decoder circuit simultaneously actuates one word line per sub-array during an in-memory computation operation.

In an embodiment, an input/output circuit for each column comprises: a plurality of bit line inputs coupled to the local bit lines of the sub-arrays; a column data output coupled to the plurality of bit line inputs and configured to generate a column data bit for output in the first mode; and a plurality of sub-array data outputs, where each sub-array data output is coupled to a corresponding one of the plurality of bit line inputs, and configured to generate a plurality of sub-array data bits for output in the second mode. A processing circuit is configured to receive feature data and perform a computational operation as a function of the feature data and the plurality of sub-array data bits.

In another embodiment, an input/output circuit for each column comprises: a plurality of bit line inputs coupled to the local bit lines of the sub-arrays; a column data output coupled to the plurality of bit line inputs and configured to generate a column data bit for output in the first mode; a computation circuit configured to store feature data and perform a computational operation as a function of the feature data and a plurality of sub-array data bits present at the plurality of bit line inputs to generate a plurality of computation data bits; and a plurality of sub-array data outputs coupled to the computation circuit and configured to output plurality of computation data bits in the second mode. A processing circuit is configured to receive plurality of computation data bits and perform application specific signal processing operations.

BRIEF DESCRIPTION OF THE DRAWINGS

For a better understanding of the embodiments, reference will now be made by way of example only to the accompanying figures in which:

FIG. 6A shows a block diagram showing circuit detail for an embodiment of a control circuit and row decoder for the circuit of FIG. 2;

FIGS. 6A1-6A3 illustrate various operations of the embodiment of the control circuit and row decoder shown in FIG. 6A;

FIGS. 6A4-6A6 show timing diagrams for circuit operation corresponding to FIGS. 6A1-6A3;

FIG. 6B shows a block diagram showing circuit detail for an embodiment of a control circuit and row decoder for the circuit of FIG. 2;

FIGS. 6B1-6B3 illustrate various operations of the embodiment of the control circuit and row decoder shown in FIG. 6B;

DETAILED DESCRIPTION OF THE DRAWINGS

Figure 2:
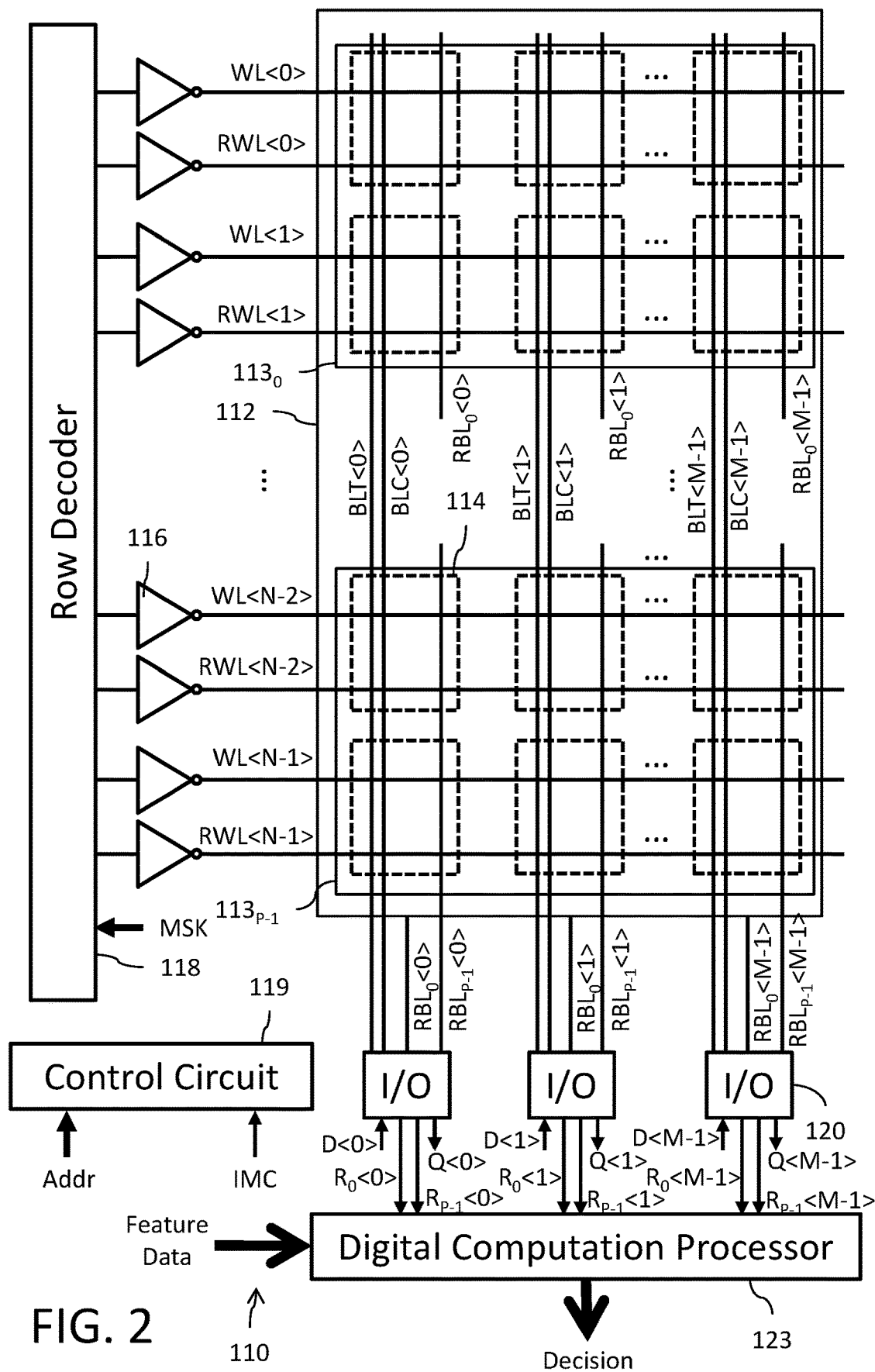
FIG. 2 is a schematic diagram of a circuit supporting both conventional memory access processing and digital in-memory computation processing.

Reference is now made to FIG. 2 which shows a block diagram of a circuit 110 supporting both conventional memory access processing and digital in-memory computation processing. The circuit 110 is implemented using a memory circuit which includes a static random access memory (SRAM) array 112 formed by a plurality of SRAM memory cells 114 arranged in a matrix format having N rows and M columns. Each memory cell 114 is programmed to store a bit of data. In conventional memory access processing, the stored data in the memory array 112 can be any desired user data. In digital in-memory computation processing, the stored data in the memory array 112 comprises computational weight or kernel data for a digital in-memory compute operation. In this context, the digital in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of data stored in the memory array, whether user data or weight data, has either a logic "1" or a logic "0" value.

Figure 3:
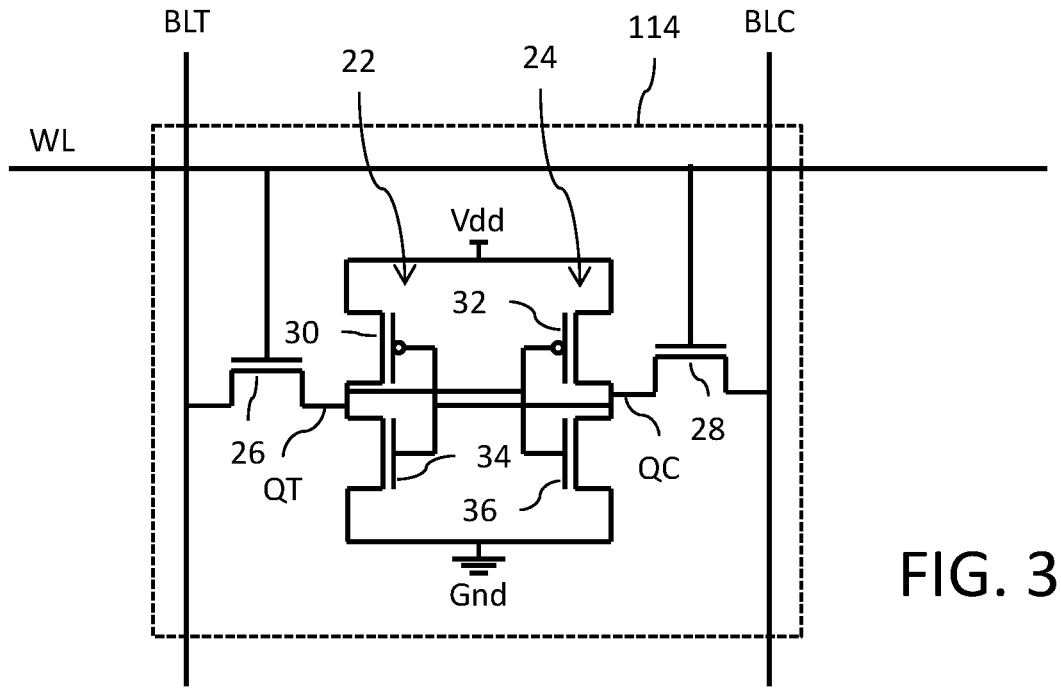
FIG. 3 is a circuit diagram of a 6T static random access memory (SRAM) cell used in the circuit of FIG. 2.

Each SRAM memory cell 114 may comprise a 6T-type memory cell as shown in FIG. 3. The cell 114 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node.

Figure 4:
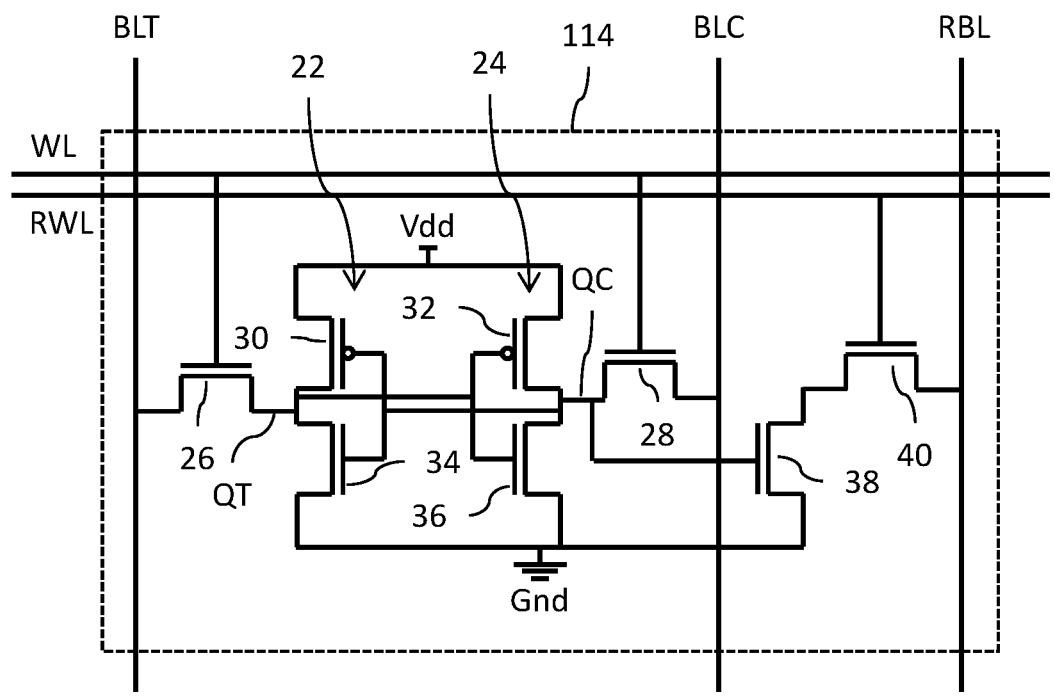
FIG. 4 is a circuit diagram of an 8T SRAM cell used in the circuit of FIG. 2.

Alternatively, each SRAM memory cell 114 may comprise an 8T-type memory cell as shown in FIG. 4. The cell 114 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. A signal path between the read bit line RBL and the low supply voltage reference is formed by series coupled transistors 38 and 40. The gate terminal of the (read) transistor 38 is coupled to the complement storage node QC and the gate terminal of the (transfer) transistor 40 is coupled to receive the signal on the read word line RWL.

It will be understood that the circuit 110 may instead use a different type of memory cell, for example, any form of a bit cell, storage element or synaptic element producing a deterministic readout arranged in an array. As a non-limiting example, consideration is made for the use of a non-volatile memory (NVM) cell such as, for example, magnetoresistive RAM (MRAM) cell, Flash memory cell, phase change memory (PCM) cell or resistive RAM (RRAM) cell). In the following discussion, focus is made on the implementation using an 8T-type SRAM cell 114, but this is done by way of a non-limiting example, understanding that any suitable memory element could be used (e.g., a binary (two level) storage element or an m-ary (multi-level) storage element).

Each cell 114 includes a word line WL, a pair of complementary bit lines BLT and BLC, a read word line RWL and a read bit line RBL. The SRAM memory cells in a common row of the matrix are connected to each other through a common word line WL and through a common read word line RWL. Each of the word lines (WL and/or RWL) is driven by a word line driver circuit 116 with a word line signal generated by a row decoder circuit 118 during read and write operations. The SRAM memory cells in a common column of the matrix across the whole array 112 are connected to each other through a common pair of complementary (write) bit lines BLT and BLC. The array 112 is segmented into P sub-arrays $113_0$ to $113_{P-1}$. Each sub-array 113 includes M columns and N/P rows of memory cells 114. The SRAM memory cells in a common column of each sub-array 113 are connected to each other through a local read bit line RBL.

The P local read bit lines $RBL_0$<x> to $RBL_{P-1}$<x> from the sub-arrays 113 for the column x in the array 112 are coupled, along with the common pair of complementary bit lines BLT<x> and BLC<x> for the column x in the array 112, to a column input/output (I/O) circuit 120(x). Here, x=0 to M−1. A data input port (D) of the column I/O circuit 120 receives input data (user or weight data) to be written to an SRAM memory cell 114 in the column through the pair of complementary bit lines BLT, BLC in response to assertion of a word line signal in a conventional memory access mode of operation. A data output port (Q) of the column I/O circuit 120 generates output data read from an SRAM memory cell 14 in the column through the read bit line RBL in response to assertion of a read word line signal in the conventional memory access mode of operation. Additionally, the column I/O circuit 120 further includes P sub-array data output ports $R_0$ to $R_{P-1}$ to generate output data read from a memory cell 114 on the local read bit line RBL of the corresponding sub-array $113_0$ to $113_{P-1}$, respectively, in response to the simultaneous assertion of a plurality of read word line signals (one per sub-array 113) in a digital in-memory compute mode of operation. A digital computation processing circuit 123 performs digital computations on the output data from the sub-array data output ports R as a function of received feature data and generates a decision output for the digital in-memory compute operation. The processing circuit 123 can implement computation logic for the digital signal processing in a number of ways including: full support of Boolean operations (XOR, XNOR, NAND, NOR, etc.) and vector operations depending on system and application needs; accumulation pipeline operations where vector multiplication is supported within the memory; and matrix vector multiplication pipeline operations where output from the memory as one vector for the multiply and accumulate (MAC) function. It will be noted that the processing circuit 123 is an integral part of the digital in-memory computation circuit 110.

The computation logic for the digital signal processing performed by processing circuit 123 is closely integrated with the input/output circuits and the sub-array data output ports $R_0$ to $R_{P-1}$ to support utilization of a wide (for example, P times) vector access. There are a number of figure of merit (FOM) benefits which accrue from this solution including: enabling multi-word access in a same cycle amortizes the common logic toggling power inside the SRAM when wide vector access occurs; the use of sub-arrays 113 can reduce bit line toggling power consumption (i.e., where P word lines are asserted in parallel to access P corresponding sub-arrays); support of both, with the opportunity to toggle between, the conventional memory access mode of operation and the digital in-memory compute mode of operation; and on/off current ratio on the same bitline improves which is a key concern when the circuitry is implemented using fully-depleted silicon-on-insulator (FDSOI) technology where forward body bias is aggressively used.

It will be noted that the circuit 110 presents a conventional SRAM interface through the data input ports D and the data output ports Q in accordance with the conventional memory access mode of operation. In response to an applied memory address (Addr), the circuit supports read (via data output ports Q) and write (via data input ports D) access to a single row of memory cells 114 in the array 112 by the selected assertion of a single word line WL or RWL. The circuit further presents a sub-array processing interface through the sub-array data output ports $R_0$ to $R_{P-1}$ in accordance with the digital in-memory compute mode of operation. In response to an applied memory address (Addr), the circuit supports simultaneous read (via data output ports $R_0$ to $R_{P-1}$) access to a single row of memory cells 114 in each of the sub-arrays $113_0$ to $113_{P-1}$ by the simultaneous assertion of corresponding read word lines RWL. A single address can be decoded to select the plural word lines (one per sub-array 113) for assertion, or plural addresses can be decoded to select the plural word lines (one per sub-array 113) for assertion. The use plural sub-arrays 113 in this mode enables parallelism supporting very wide access for computation processing without sacrificing density. Advantageously, this digital in-memory compute mode of operation utilizes the resources of the conventional SRAM design with modified control, decoding and input/output circuits (as will be discussed herein in detail) to enable parallel access in the digital in-memory compute mode of operation with additional control to toggle between the conventional memory access mode of operation and the digital in-memory compute mode of operation as needed by the system application. This architecture brings parallelism with usage of the push rule bitcell thus enabling high density/compute density when configured for the in-memory compute mode of operation. Notwithstanding the foregoing, as noted above, usage of other bitcell types may instead be made.

A control circuit 119 controls mode operations of the circuitry within the circuit 110 responsive to the logic state of a control signal IMC. When the control signal IMC is in a first logic state (for example, logic low), the circuit 110 operates in accordance with the conventional memory access mode of operation (for writing data from data input port D to the memory array or reading data from the memory array to data output port Q). Conversely, when the control signal IMC is in a second logic state (for example, logic high), the circuit 110 operates in accordance with the digital in-memory compute mode of operation (for reading weight data from the memory array to the sub-array data output ports R).

When the circuit 110 is operating in the conventional memory access mode of operation, the row decoder circuit 118 decodes a received address (Addr), selectively actuates only one word line WL (during write) or one read word line RWL (during read) for the whole array 112 with a word line signal pulse to access a corresponding single one of the rows of memory cells 114. In write, logic states of the data at the input ports D are written by the column I/O circuits 120 through the pairs of complementary bit lines BLT, BLC to the single row of memory cells coupled to the accessed word line WL. In read, the logic states of the data stored in the single row of memory cells coupled to the accessed word line WL are output from the read bit lines RBL to the column I/O circuits 120 for output at the data output ports Q.

When the circuit 110 is operating in the digital in-memory compute mode of operation, the row decoder circuit 118 decodes a received address (Addr), selectively (and simultaneously) actuates one read word line RWL in each sub-array 113 in the memory array 112 with a word line signal pulse to access a corresponding row of memory cells 114 in each sub-array 113. The logic states of the weight data stored in the row of memory cells coupled to the accessed read word line RWL in each sub-array 113 are passed from the read bit lines $RBL_0<x>$ to $RBL_{P-1}<x>$ to the column I/O circuit 120 for output at the corresponding sub-array data output ports $R_0$ to $R_{P-1}$.

It will be noted that each sub-array 113 output can be considered as one subtensor/tensor for processing operations. Additionally, multiple sub-arrays 113 outputs can be grouped as a larger tensor. The grouping of sub-array outputs can be made across columns, across rows, or both. Such processing is supported through the configuration and operation of the processing circuit 123.

The architecture shown in FIG. 2 presents a number of advantages for digital in-memory computation including: very wide vector access is enabled for supporting high dimensional tensor processing for an artificial neural network (ANN); hyper dimensional computing for artificial intelligence (AI) training and inference workloads is also supported; the computation is deterministic with a wide range of weight data and feature data precisions and number formats permitted for neural network applications (noting that this is a significant differentiation versus analog in-memory computation—which is limited to simplified signed/unsigned integer formats); and the solution is extendable to incorporate additional stochastic compute modes to gain area and power efficiency.

Figure 5A:
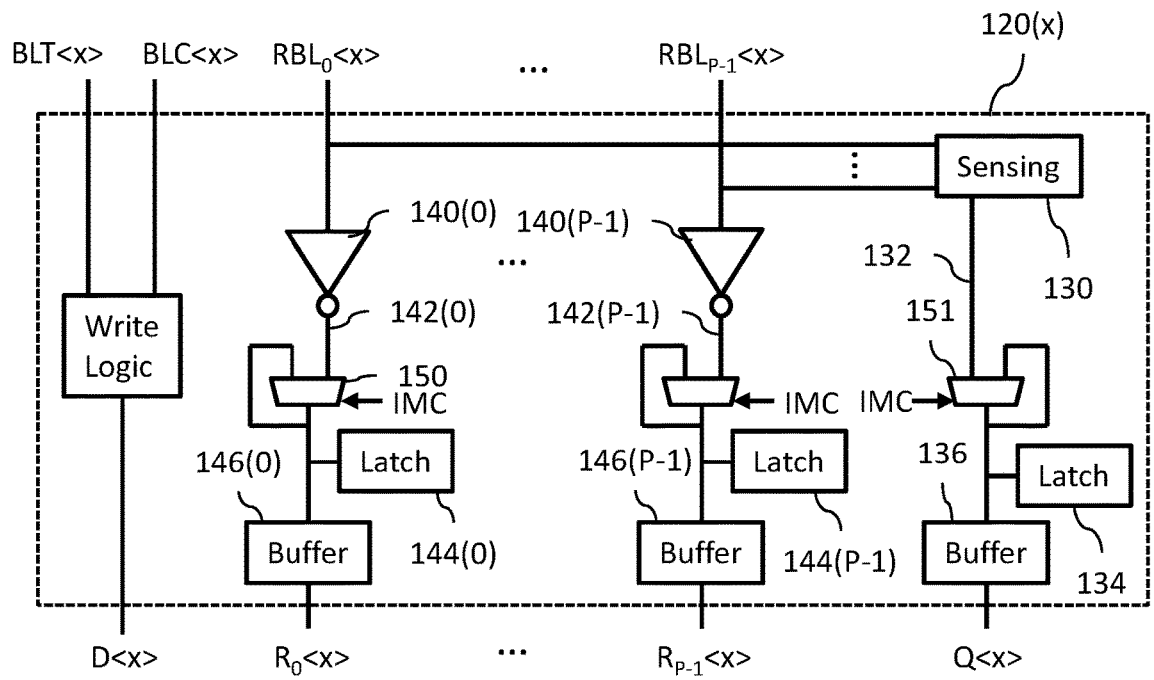
FIGS. 5A-5B show block diagrams for embodiments of a column I/O circuit for the memory circuit in FIG. 2.

A block diagram of an embodiment for the column I/O circuit 120 is shown in FIG. 5A. The column I/O circuit 120(x) is coupled to the pair of complementary bit lines BLT<x>, BLC<x> for the column x in the array 112. The bit at the data input port D<x> is coupled through a write logic circuit to drive the pair of complementary bit lines. The column I/O circuit 120(x) is also coupled to the P local read bit lines $RBL_0<x>$ to $RBL_{P-1}<x>$ from the sub-arrays 113 for the column x in the array 112 through a read logic circuit.

A sensing circuit 130 of the read logic circuit is coupled to receive the data on the P local read bit lines $RBL_0<x>$ to $RBL_{P-1}<x>$ and generate a sensed data bit on signal line 132. As an example, the sensing circuit 130 may comprise a logic NAND gate. The sensed data bit is applied to the first input of a multiplexer circuit 151 whose select input receives the control signal IMC. The second input of the multiplexer circuit 151 is coupled to the output of the multiplexer circuit 151. The data at the output of multiplexer circuit 151 is latched by latch circuit 134 and buffered by buffer circuit 136 for output at the data output port Q<x>. When the control signal IMC is in the first logic state (for example, logic low—when the circuit 110 is operating in accordance with the conventional memory access mode of operation), the multiplexer circuit 151 selects the data on signal line 132. Conversely, when the control signal IMC is in the second logic state (for example, logic high—when the circuit 110 is operating in accordance with the digital in-memory compute mode of operation), the multiplexer circuit 151 selects the data at the output of the multiplexer circuit 151 (i.e., the data held by the latch 134).

A sensing circuit 140(y) of the read logic circuit is coupled to receive the data on the local read bit line $RBL_y<x>$ and generate a sensed data bit on signal line 142(y). Here, y=0 to P−1. As an example, each sensing circuit 140 may comprise a logic NOT gate. The sensed data bit is applied to the second input of a multiplexer circuit 150 whose select input receives the control signal IMC. The first input of the multiplexer circuit 150 is coupled to the output of the multiplexer circuit 150. The data at the output of multiplexer circuit 150 is latched by latch circuit 144(y) and buffered by buffer circuit 146(y) for output at the sub-array data output port $R_y<x>$. When the control signal IMC is in the first logic state (for example, logic low—when the circuit 110 is operating in accordance with the conventional memory access mode of operation), the multiplexer circuit 150 selects the data at the output of the multiplexer circuit 150 (i.e., the data held by the latch 144). Conversely, when the control signal IMC is in the second logic state (for example, logic high—when the circuit 110 is operating in accordance with the digital in-memory compute mode of operation), the multiplexer circuit 150 selects the data on signal line 142.

Figure 5B:
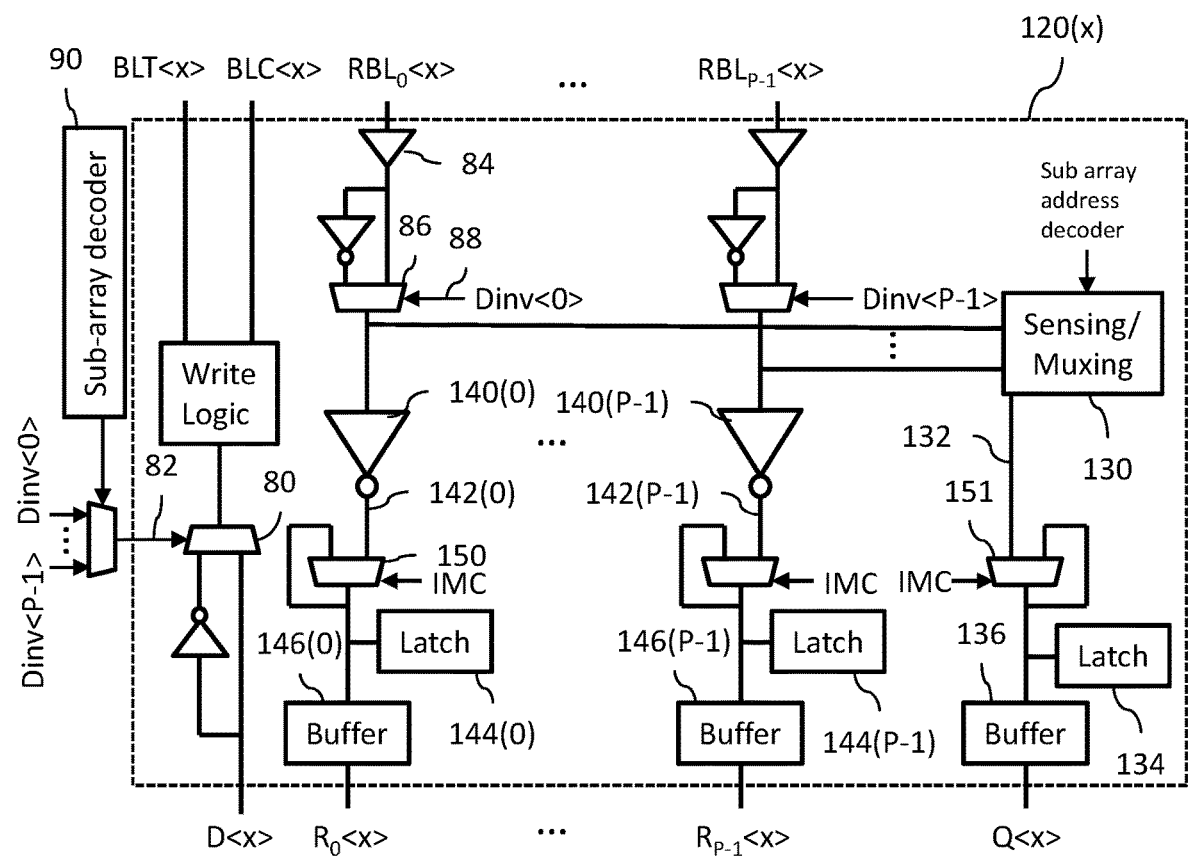

FIG. 5B shows a block diagram of another embodiment for the column I/O circuit 120. Same references in FIGS. 5A and 5B refer to same or similar components, the description of which will not be repeated. The circuit 120 of FIG. 5B differs from the circuit 120 of FIG. 5A primarily in connection with supporting polarity control for weight data stored in the memory cells 114. It will be noted that when the memory cell 114 stores a logic 0 (i.e., QT=0, QC=1), the read bit line RBL will be discharged to ground. Conversely, when the memory stores a logic 1, the read bit line RBL is not discharged. Thus, there is a gain in power of about 50% when memory cell stores logic 1. This fact can be advantageously used to reduce power consumption of the circuit 110. In a neural network application, the weight data that is written to the memory cells is pre-known, and because of this it can be selectively written to the memory in a least power state (i.e., emphasizing the storage of logic 1's over the storage of logic 0's). So, if a given set of weight data includes more bits at logic 0 than at logic 1, this weight data can be inverted and then stored in that inverted state in order to achieve a power gain. With that data stored inverted, however, it must be inverted after reading from the memory array to return to its original logic state. The circuit implementation shown in FIG. 5B achieves this processing.

The data bit at the input port D<x> is applied to the first input of a multiplexer 80 and a logical inversion of the data bit is applied to the second input of the multiplexer 80. The selection input of the multiplexer 80 receives a selection signal 82 whose logic state is dependent on whether the bit or the logical inversion of the bit is to be written by the write logic circuit to the memory cell over the bit lines BLT, BLC.

The data bit on the local read bit line $RBL_y$<x> is buffered by a buffer circuit 84 and applied to the first input of a multiplexer 86 and a logical inversion of the buffered data bit is applied to the second input of the multiplexer 86. The selection input of the multiplexer 86 receives a selection signal 88 whose logic state is dependent on whether the bit or the logical inversion of the bit is to be read from the memory cell over the read bit line.

In connection with performing the operation to write weight data to the memory, a determination is made as to whether, for a given row of memory cells or for a given sub-array, there are more logic 1 bits or more logic 0 bits. In the case where there are more logic 0 bits, the selection signal 82 has a logic state to control the multiplexer circuits 80 of the column I/O circuits 120 to select the logical inversion of the data bits and those logically inverted data bits are written to the memory. A record of this is kept by the system 110 so that whenever an in-memory compute operation accesses weight data stored as logically inverted, the selection signal 88 has a logic state to control the multiplexer circuits 86 of the column I/O circuits 120 to select the logical inversion of the data bits and those logically inverted data bits are processed by the sensing circuits 140.

Consider the example where logic state analysis of the weight data is made at the level of the sub-array 113. If the weight data to be stored in a given sub-array includes more logic 0 bits, the data inversion signal Dinv for that sub-array is latched in an asserted state. Responsive to sub-array decoder 90 selection of that sub-array for a data write operation, a multiplexer circuit 92 is controlled to select the asserted data inversion signal Dinv for application as signal 82 and the multiplexer 80 selects the logically inverted data bit for writing to the memory. Responsive to a data read in connection with an in-memory compute operation, the asserted data inversion signal Dinv is applied as signal 88 and the multiplexer 86 selects the logically inverted data bit for read from the memory.

It will be noted that polarity inversion control can be specific to a group of subtensor segments that make up the full tensor readout. Because the logic states of the weight data are pre-known, the logic states of the data inversion signals Dinv can be selected and latched. Data polarity control can be made specific to each sub-tensor array in order to control the state of the data stored in each row of the sub-array (acting as on subtensor/tensor) based on data sparsity.

The example shown in FIG. 5B provides a separate data inversion signal for each sub-array, with that signal shared across all the I/O circuits 120. The logic state of the data inversion signal is controlled by the system 110 based the analysis of the logic states of the pre-known weight data arrangement.

Reference is now made to FIG. 6A which shows a block diagram illustrating circuit detail for an embodiment of the control circuit 119 and row decoder 118 for the circuit 110 of FIG. 2. The row decoder 118 includes P sub-decoder circuits $118_0$ to $118_{P-1}$ corresponding to the P sub-arrays $113_0$ to $113_{P-1}$. The control circuit 119 receives the memory address Addr and the control signal IMC. An address pre-decoding circuit of the control circuit 119 decodes the address Addr to generate decoder control signals 121 which are applied to each of the sub-decoder circuits $118_0$ to $118_{P-1}$. Each sub-decoder circuit 118 decodes the decoder control signals 121 to determine whether to generate a word line signal and if yes to further identify the specific word line to which the word line signal is applied. If the control signal IMC is in the first logic state (for example, logic low—when the circuit 110 is operating in accordance with the conventional memory access mode of operation), the address pre-decoding circuit of the control circuit 119 will decode the address Addr to generate the decoder control signals 121 in a way which will result in only one of the sub-decoder circuits $118_0$ to $118_{P-1}$ generating a word line signal for application to only one word line for the array 112. However, if the control signal IMC is in the second logic state (for example, logic high—when the circuit 110 is operating in accordance with the digital in-memory compute mode of operation), the address predecoding circuit of the control circuit 119 will decode the address Addr to generate the decoder control signals 121 in a way which will result in each of the sub-decoder circuits $118_0$ to $118_{P-1}$ generating a word line signal for application to one word line per sub-array 113.

The circuit 110 is further configured to receive a P-bit mask signal MSK. The bits of this mask signal function as sub-decoder circuit enable signals. If the bit z of the mask signal MSK<z> is in a first logic state (for example, logic low), the corresponding sub-decoder circuit 118z is enabled and will generate a word line signal for application to one word line of the corresponding sub-array 113z. However, if the bit z of the mask signal MSK<z> is in a second logic state (for example, logic high), the corresponding sub-decoder circuit 118z is disabled and will not generate a word line signal for application to one word line of the corresponding sub-array 113z. It will be noted that exercising control over word line signal generation using the mask signal MSK is applicable only when the control signal IMC is in the second logic state (for example, logic high—when the circuit 110 is operating in accordance with the digital in-memory compute mode of operation).

Figure 1:
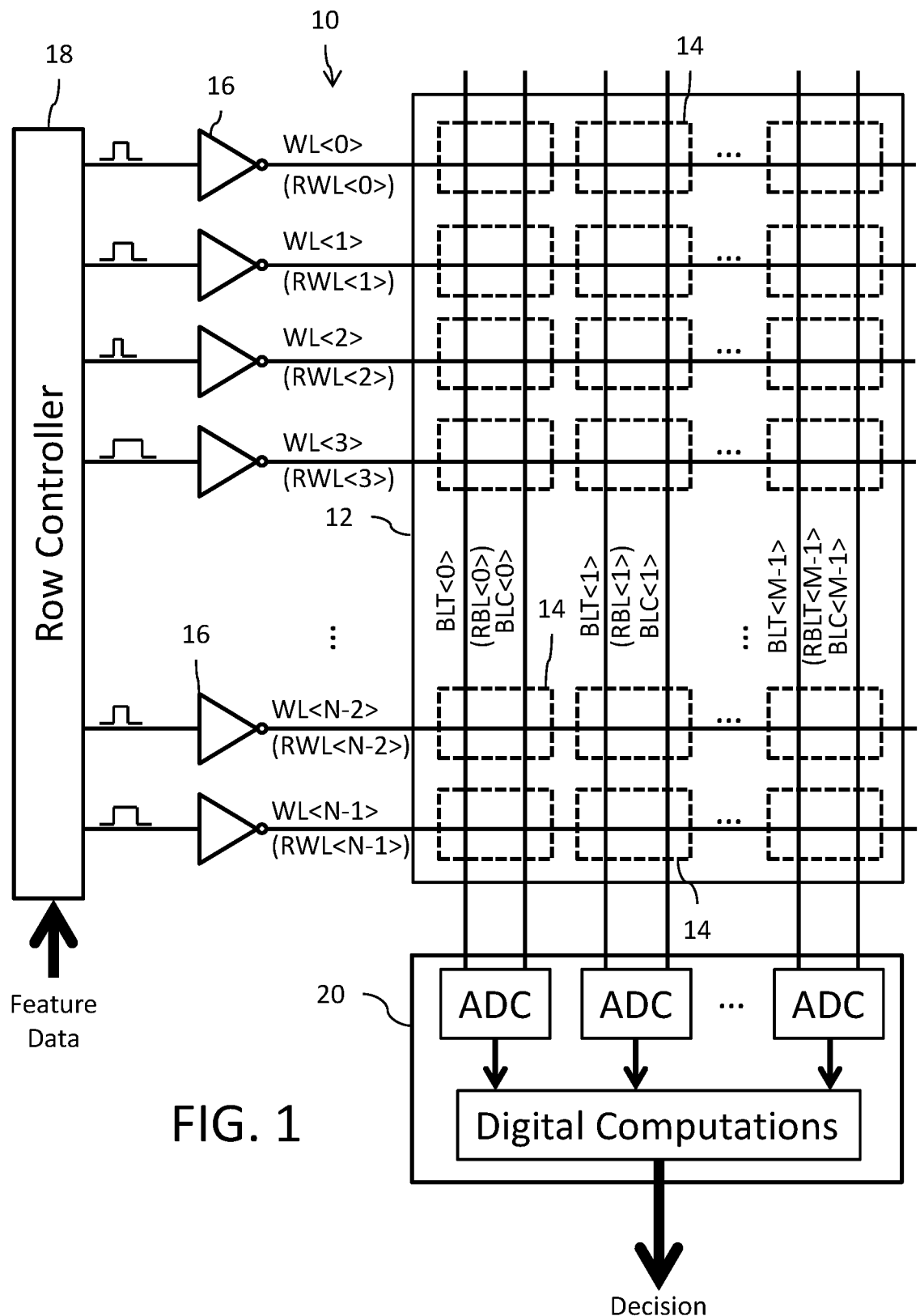
FIG. 1 is a schematic diagram of an analog in-memory computation circuit.

FIG. 6A1 shows an example of operation of the circuitry of FIG. 6A where IMC=0 and Addr=AddressK, where AddressK is associated with word line WL<K> (or read word line RWL<K>). With IMC=0, the circuit 110 is operating in the conventional memory access mode of operation. The address predecoding circuit of the control circuit 119 decodes AddressK to generate the decoder control signals 121 which are applied to each of the sub-decoder circuits $118_0$ to $118_{P-1}$. In this case, word line WL<K> (or read word line RWL<K>) is output from sub-decoder circuit $118_1$ which will be enabled to generate a word line signal.

FIG. 6A2 shows an example of operation of the circuitry of FIG. 6A where IMC=1, Addr=AddressJ, where AddressJ is associated with a set of read word lines WL<J>, and all bits of the mask signal MSK are logic 0. With IMC=1, the circuit 110 is operating in the digital in-memory compute mode of operation. The address predecoding circuit of the control circuit 119 decodes AddressJ to generate the decoder control signals 121 which are applied to each of the sub-decoder circuits $118_0$ to $118_{P-1}$. In this case, one read word line RWL<J> is output from each of P sub-decoder circuits 118 which are enabled to generate the word line signals.

FIG. 6A3 shows an example of operation of the circuitry of FIG. 6A where IMC=1, Addr=AddressJ, where AddressJ is associated with a set of read word lines WL<J>, and all bits of the mask signal MSK are logic 0 except for bit MSK<1>=1. With IMC=1, the circuit 110 is operating in the digital in-memory compute mode of operation. The address predecoding circuit of the control circuit 119 decodes AddressJ to generate the decoder control signals 121 which re applied to each of the sub-decoder circuits $118_0$ to $118_{P-1}$. In this case, each of P sub-decoder circuits 118 are instructed to generate a read word line RWL<J> signal. However, with MSK<1>=1, the corresponding sub-decoder $118_1$ is disabled and will not generate a word line signal for sub-array $113_1$. The non-masked sub-decoders 118 are enabled to generate the word line signal at the read word line RWL<J> output.

With reference once again to FIG. 6A, the following table illustrates the full address decoding function performed by the control circuit 119 and row decoder 118 for the circuit 110 shown in FIG. 2 for an example implementation where P=4 and N=32. Thus, each sub-array 113 includes N/P=8 rows. There would be five bits in the address Addr<A0,A1,A2,A3,A4> needed to individually address the 32 rows. The left side of the table shows the logic states for the possible addresses, the middle of the table shows the actuated word line for each address when the control signal IMC is in the first logic state (for example, logic low—when the circuit 110 is operating in accordance with the conventional memory access mode of operation), and the right side of the table shows the actuated word lines for each address when the control signal IMC is in the second logic state (for example, logic high—when the circuit 110 is operating in accordance with the digital in-memory compute mode of operation). It will be noted that the designation "WL" in the table is generic: in the conventional memory access mode of operation the designation "WL" is the word line WL for data write and is the read word line RWL for data read; and in the digital in-memory compute mode of operation the designation "WL" is the read word line RWL.

| A4 | A3 | A2 | A1 | A0 | Conv. Mode | | IMC Mode | | |
|----|----|----|----|----|------------|---|----------|---|---|
| 0 | 0 | 0 | 0 | 0 | WL<0> | WL<0> | WL<8> | WL<16> | WL<24> |
| 0 | 0 | 0 | 0 | 1 | WL<1> | WL<1> | WL<9> | WL<17> | WL<25> |
| 0 | 0 | 0 | 1 | 0 | WL<2> | WL<2> | WL<10> | WL<18> | WL<26> |
| 0 | 0 | 0 | 1 | 1 | WL<3> | WL<3> | WL<11> | WL<19> | WL<27> |
| 0 | 0 | 1 | 0 | 0 | WL<4> | WL<4> | WL<12> | WL<20> | WL<28> |
| 0 | 0 | 1 | 0 | 1 | WL<5> | WL<5> | WL<13> | WL<21> | WL<29> |
| 0 | 0 | 1 | 1 | 0 | WL<6> | WL<6> | WL<14> | WL<22> | WL<30> |
| 0 | 0 | 1 | 1 | 1 | WL<7> | WL<7> | WL<15> | WL<23> | WL<31> |
| 0 | 1 | 0 | 0 | 0 | WL<8> | WL<0> | WL<8> | WL<16> | WL<24> |
| 0 | 1 | 0 | 0 | 1 | WL<9> | WL<1> | WL<9> | WL<17> | WL<25> |
| 0 | 1 | 0 | 1 | 0 | WL<10> | WL<2> | WL<10> | WL<18> | WL<26> |
| 0 | 1 | 0 | 1 | 1 | WL<11> | WL<3> | WL<11> | WL<19> | WL<27> |
| 0 | 1 | 1 | 0 | 0 | WL<12> | WL<4> | WL<12> | WL<20> | WL<28> |
| 0 | 1 | 1 | 0 | 1 | WL<13> | WL<5> | WL<13> | WL<21> | WL<29> |
| 0 | 1 | 1 | 1 | 0 | WL<14> | WL<6> | WL<14> | WL<22> | WL<30> |
| 0 | 1 | 1 | 1 | 1 | WL<15> | WL<7> | WL<15> | WL<23> | WL<31> |
| 1 | 0 | 0 | 0 | 0 | WL<16> | WL<0> | WL<8> | WL<16> | WL<24> |
| 1 | 0 | 0 | 0 | 1 | WL<17> | WL<1> | WL<9> | WL<17> | WL<25> |
| 1 | 0 | 0 | 1 | 0 | WL<18> | WL<2> | WL<10> | WL<18> | WL<26> |
| 1 | 0 | 0 | 1 | 1 | WL<19> | WL<3> | WL<11> | WL<19> | WL<27> |
| 1 | 0 | 1 | 0 | 0 | WL<20> | WL<4> | WL<12> | WL<20> | WL<28> |
| 1 | 0 | 1 | 0 | 1 | WL<21> | WL<5> | WL<13> | WL<21> | WL<29> |
| 1 | 0 | 1 | 1 | 0 | WL<22> | WL<6> | WL<14> | WL<22> | WL<30> |
| 1 | 0 | 1 | 1 | 1 | WL<23> | WL<7> | WL<15> | WL<23> | WL<31> |
| 1 | 1 | 0 | 0 | 0 | WL<24> | WL<0> | WL<8> | WL<16> | WL<24> |
| 1 | 1 | 0 | 0 | 1 | WL<25> | WL<1> | WL<9> | WL<17> | WL<25> |
| 1 | 1 | 0 | 1 | 0 | WL<26> | WL<2> | WL<10> | WL<18> | WL<26> |
| 1 | 1 | 0 | 1 | 1 | WL<27> | WL<3> | WL<11> | WL<19> | WL<27> |
| 1 | 1 | 1 | 0 | 0 | WL<28> | WL<4> | WL<12> | WL<20> | WL<28> |
| 1 | 1 | 1 | 0 | 1 | WL<29> | WL<5> | WL<13> | WL<21> | WL<29> |
| 1 | 1 | 1 | 1 | 0 | WL<30> | WL<6> | WL<14> | WL<22> | WL<30> |
| 1 | 1 | 1 | 1 | 1 | WL<31> | WL<7> | WL<15> | WL<23> | WL<31> |

For the example shown in FIG. 6A1, where IMC=0, consider that AddressK=Addr<0,1,1,0>. This is decoded to identify word line WL<14> when writing to the memory (or RWL<14> when reading from the memory), and sub-decoder $118_1$ will generate the word line signal on only that word line. No other sub-decoders 118 will generate a word line signal. The timing for this operation is shown in FIG. 6A4 (where word line signal WL<-> (and RWL<->) is logic low for all word lines other than the selected word line WL<14> (or RWL<14>). Note also that the data output Q may change state in response to the memory read operation, and there is no change in state for the sub-array data outputs $R_0$-$R_3$ (because the digital in-memory compute mode of operation is not enabled by the signal IMC and the multiplexers 150 are holding the data values of the latches 144).

For the example shown in FIG. 6A2, where IMC=1, consider that AddressJ=Addr<0,1,1,1,0> and the mask signal is MSK<0,0,0,0>. This address is decoded to identify word lines RWL<6>, RWL<14>, RWL<22> and RWL<30> and sub-decoder $118_0$ will generate the word line signal on word line RWL<6> (because corresponding MSK bit is 0), sub-decoder $118_1$ will generate the word line signal on word line RWL<14> (because corresponding MSK bit is 0), sub-decoder $118_2$ will generate the word line signal on word line RWL<22> (because corresponding MSK bit is 0), and sub-decoder $118_3$ will generate the word line signal on word line RWL<30> (because corresponding MSK bit is 0). No other word lines will be selected by the sub-decoders 118 for generating a word line signal. The timing for this operation is shown in FIG. 6A5 (where word line signal RWL<-> is logic low for all word lines other than the selected and non-masked word lines RWL<6>, RWL<14>, RWL<22> and RWL<30>). Note also that the sub-array data outputs $R_0$-$R_3$ may change state in response to the memory read operation, and there is no change in state for the data output Q (because the conventional mode of operation is not enabled by the signal IMC and the multiplexer 151 is holding the data value of the latch 134).

For the example shown in FIG. 6A3, where IMC=1, consider that AddressJ=Addr<0,1,1,1,0> and the mask signal MSK<0,0,0,1>. This address is decoded to identify word lines RWL<6>, RWL<14>, RWL<22> and RWL<30> and sub-decoder $118_0$ will NOT generate a word line signal on word line RWL<6> (because corresponding MSK bit is 1 and the sub-decoder is disabled), sub-decoder $118_1$ will generate the word line signal on word line RWL<14> (because corresponding MSK bit is 0), sub-decoder $118_2$ will generate the word line signal on word line RWL<22> (because corresponding MSK bit is 0), and sub-decoder $118_3$ will generate the word line signal on word line RWL<30> (because corresponding MSK bit is 0). No other word lines will be selected by the sub-decoders 118 for generating a word line signal. The timing for this operation is shown in FIG. 6A6 (where word line signal RWL<-> is logic low for all word lines other than the selected and non-masked word lines RWL<14>, RWL<22> and RWL<30>, and where masked word line RWL<6> is also logic low). Note also that the sub-array data outputs $R_1$-$R_3$ may change state in response to the memory read operation, but that sub-array data output $R_0$ will not change state because of the masking by mask signal MSK which disables sub-decoder $118_0$, and there is no change in state for the data output Q (because the conventional mode of operation is not enabled by the signal IMC and the multiplexer 151 is holding the data value of latch 134).

Reference is now made to FIG. 6B which shows a block diagram showing circuit detail for an embodiment of the control circuit 119 and row decoder 118 for the circuit 110 of FIG. 2. The row decoder 118 includes P sub-decoder circuits $118_0$ to $118_{P-1}$ corresponding to the P sub-arrays $113_0$ to $113_{P-1}$. The control circuit 119 receives the Address M-Addr, a set of addresses IMC-Addr0 to IMC-AddrP-1 and the mask signal IMC. A first address predecoding circuit of the control circuit 119 decodes the address M-Addr (when provided in connection with execution of the first mode of operation for memory access) to generate decoder control signals 121-M which are selectively applied through a multiplexer circuit 117 as decoder control signals 121 to each of the sub-decoder circuits $118_0$ to $118_{P-1}$. A second address predecoding circuit of the control circuit 119 decodes the addresses IMC-Addr0 to IMC-AddrP-1 (when provided in connection with execution of the second mode of operation for in-memory computation) to generate decoder control signals 121-IMC which are selectively applied through the multiplexer circuit 117 as decoder control signals 121 to each of the sub-decoder circuits $118_0$ to $118_{P-1}$. Each sub-decoder circuit 118 decodes the decoder control signals 121 to determine whether to generate a word line signal and if yes to further identify the specific word line to which the word line signal is applied.

The selection input of the multiplexer circuit 117 receives the control signal IMC. If the control signal IMC is in the first logic state (for example, logic low—when the circuit 110 is operating in accordance with the conventional memory access mode of operation), the multiplexer circuit 117 selects decoder control signals 121-M for output as the decoder control signals 121 to each of the sub-decoder circuits $118_0$ to $118_{P-1}$. The first address predecoding circuit of the control circuit 119 decodes the address M-Addr to generate the decoder control signals 121-M, 121 in a way which will result in only one of the sub-decoder circuits $118_0$ to $118_{P-1}$ generating a word line signal for application to only one word line for the array 112. However, if the control signal IMC is in the second logic state (for example, logic high—when the circuit 110 is operating in accordance with the digital in-memory compute mode of operation), the multiplexer circuit 117 selects decoder control signals 121-IMC for output as the decoder control signals 121 to each of the sub-decoder circuits $118_0$ to $118_{P-1}$. The second address predecoding circuit of the control circuit 119 decodes each of the addresses IMC-Addr0 to IMC-AddrP-1 to generate the decoder control signals 121-IMC, 121 in a way which will result in each of the sub-decoder circuits $118_0$ to $118_{P-1}$ generating a word line signal for application to one word line per sub-array 113. In particular, each address IMC-Addr when decoded will specify a certain one of the word lines of the corresponding sub-array 113 to which the word line signal is to be applied.

The circuit 110 is further configured to receive a P-bit mask signal MSK. The bits of this mask signal function as sub-decoder circuit enable signals. If the bit z of the mask signal MSK<z> is in a first logic state (for example, logic low), the corresponding sub-decoder circuit 118z is enabled and will generate a word line signal for application to one word line of the corresponding sub-array 113z. However, if the bit z of the mask signal MSK<z> is in a second logic state (for example, logic high), the corresponding sub-decoder circuit 118z is disabled and will not generate a word line signal for application to one word line of the corresponding sub-array 113z. It will be noted that exercising control over word line signal generation using the mask signal MSK is applicable only when the control signal IMC is in the second logic state (for example, logic high—when the circuit 110 is operating in accordance with the digital in-memory compute mode of operation).

FIG. 6B1 shows an example of operation of the circuitry of FIG. 6B where IMC=0 and M-Addr=AddressK, where AddressK is associated with word line WL<K> when writing data (or read word line RWL<K> when reading data). With IMC=0, the circuit 110 is operating in the conventional memory access mode of operation and the multiplexer circuit 117 selects decoder control signals 121-M. The first address predecoding circuit of the control circuit 119 decodes AddressK to generate the decoder control signals 121-M, 121 which are applied to each of the sub-decoder circuits $118_0$ to $118_{P-1}$. In this case, word line WL<K> (or read word line RWL<K>) is output from sub-decoder circuit $118_1$ which will be enabled to generate a word line signal.

In the context of the previous table for full address decoding function performed by the control circuit 119 and row decoder 118, consider the scenario where IMC=0 and M-Addr<0,1,1,1,0>. This is decoded to identify word line WL<14> when writing to the memory (or RWL<14> when reading from the memory), and sub-decoder $118_1$ will generate the word line signal on only that word line. No other sub-decoders 118 will generate a word line signal. The timing for this operation is similar to that shown in FIG. 6A4 (where word line signal WL<-> (and RWL<->) is logic low for all word lines other than the selected word line WL<14> (or RWL<14>)). Note also that the data output Q may change state in response to the memory read operation, and there is no change in state for the sub-array data outputs $R_0$-$R_4$ (because the digital in-memory compute mode of operation is not enabled by the signal IMC and the multiplexers 150 are holding the data values of the latches 144).

FIG. 6B2 shows an example of operation of the circuitry of FIG. 6B where IMC=1, IMC-Addr0=Addressa (where Addressa is associated with read word line RWL<a>), IMC-Addr1=Addressb (where Addressb is associated with read word line RWL<b>), IMC-AddrP−1=Addressc (where Addressc is associated with read word line RWL<c>), and all bits of the mask signal MSK are logic 0. With IMC=1, the circuit 110 is operating in the digital in-memory compute mode of operation and the multiplexer circuit 117 selects decoder control signals 121-IMC. The second address pre-decoding circuit of the control circuit 119 decodes Addressa, Addressb, . . . , Addressc to generate the decoder control signals 121-M, 121 which are applied to each of the sub-decoder circuits 118$_0$ to 118$_{P-1}$. In this case, each of P sub-decoder circuits 118 generates a word line signal on a single word line. Specifically: the address IMC-Addr0 is specific for sub-decoder 118$_0$, and the predecoding of Addressa identifies the word line RWL<a> for generation of a word line signal; the address IMC-Addr1 is specific for sub-decoder 118$_1$, and the predecoding of Addressb identifies the word line RWL<b> for generation of a word line signal; and the address IMC-AddrP−1 is specific for sub-decoder 118$_{P-1}$, and the predecoding of Addressc identifies the word line RWL<c> for generation of a word line signal.

In the context of the previous table for full address decoding function performed by the control circuit 119 and row decoder 118, consider the scenario where IMC=1, the mask signal MSK<0,0,0,0>, IMC-Addr0<0,0,1,1,0>, IMC-Addr1<0,1,1,1,0>, IMC-Addr2<1,0,1,1,0> and IMC-Addr3<1,1,1,1,0>. These addresses are decoded to identify word lines RWL<6>, RWL<14>, RWL<22> and RWL<30> and sub-decoder 118$_0$ will generate the word line signal on RWL<6> (because corresponding MSK bit is 0), sub-decoder 118$_1$ will generate the word line signal on word line RWL<14> (because corresponding MSK bit is 0), sub-decoder 118$_2$ will generate the word line signal on word line RWL<22> (because corresponding MSK bit is 0), and sub-decoder 118$_3$ will generate the word line signal on word line RWL<30> (because corresponding MSK bit is 0). No other word lines will be selected by the sub-decoders 118 for generating a word line signal. The timing for this operation is similar to that shown in FIG. 6A5 (where word line signal RWL<-> is logic low for all word lines other than the selected and non-masked word lines RWL<6>, RWL<14>, RWL<22> and RWL<30> and Addr[IMC-Addr0, IMC-Addr1, IMC-Addr2> and IMC-Addr3]). Note also that the sub-array data outputs R$_0$-R$_3$ may change state in response to the memory read operation, and there is no change in state for the data output Q (because the conventional mode of operation is not enabled by the signal IMC and the multiplexer 151 is holding the data value of the latch 134).

FIG. 6B3 shows an example of operation of the circuitry of FIG. 7B where IMC=1, IMC-Addr0=Addressa (where Addressa is associated with read word line RWL<a>), IMC-Addr1=Addressb (where Addressb is associated with read word line RWL<b>), IMC-AddrP−1=Addressc (where Addressc is associated with read word line RWL<c>), and all bits of the mask signal MSK are logic 0 except for bit MSK<1>=1. With IMC=1, the circuit 110 is operating in the digital in-memory compute mode of operation. The second address predecoding circuit of the control circuit 119 decodes Addressa, Addressb, . . . , Addressc to generate the decoder control signals 121 which are applied to each of the sub-decoder circuits 118$_0$ to 118$_{P-1}$. In this case, the address decoding specifies that each of P sub-decoder circuits 118 is to generate a word line signal. Specifically: the address IMC-Addr0 is specific for sub-decoder 118$_0$, and the pre-decoding of Addressa identifies the word line RWL<a> for generation of a word line signal; the address IMC-Addr1 is specific for sub-decoder 118$_1$, and the predecoding of Addressb identifies the word line RWL<b> for generation of a word line signal; and the address IMC-AddrP−1 is specific for sub-decoder 118$_{P-1}$, and the predecoding of Addressc identifies the word line RWL<c> for generation of a word line signal. However, with MSK<1>=1, the corresponding sub-decoder 118$_1$ is disabled and will not generate a word line signal on word line RWL<b> for sub-array 113$_1$.

In the context of the previous table for full address decoding function performed by the control circuit 119 and row decoder 118, consider the scenario where IMC=1, and the mask signal MSK<0,0,0,1>, IMC-Addr0<0,0,1,1,0>, IMC-Addr1<0,1,1,1,0>, IMC-Addr2<1,0,1,1,0> and IMC-Addr3<1,1,1,1,0>. These addresses are decoded to identify word lines RWL<6>, RWL<14>, RWL<22> and RWL<30> and sub-decoder 118$_0$ will NOT generate the word line signal on RWL<6> (because corresponding MSK bit is 1), sub-decoder 118$_1$ will generate the word line signal on word line RWL<14> (because corresponding MSK bit is 0), sub-decoder 118$_2$ will generate the word line signal on word line RWL<22> (because corresponding MSK bit is 0), and sub-decoder 118$_3$ will generate the word line signal on word line RWL<30> (because corresponding MSK bit is 0). No other word lines will be selected by the sub-decoders 118 for generating a word line signal. The timing for this operation is similar to that shown in FIG. 6A6 (where word line signal RWL<-> is logic low for all word lines other than the selected and non-masked word lines RWL<14>, RWL<22> and RWL<30>, and where masked word line RWL<6> is also logic low, and Addr[IMC-Addr0, IMC-Addr1, IMC-Addr2> and IMC-Addr3]). Note also that the sub-array data outputs R$_1$-R$_3$ may change state in response to the memory read operation, but that sub-array data output R$_0$ will not change state because of the masking by mask signal MSK which disables sub-decoder 118$_0$, and there is no change in state for the data output Q (because the conventional mode of operation is not enabled by the signal IMC and the multiplexer 151 is holding the data value of the latch 134).

Figure 7:
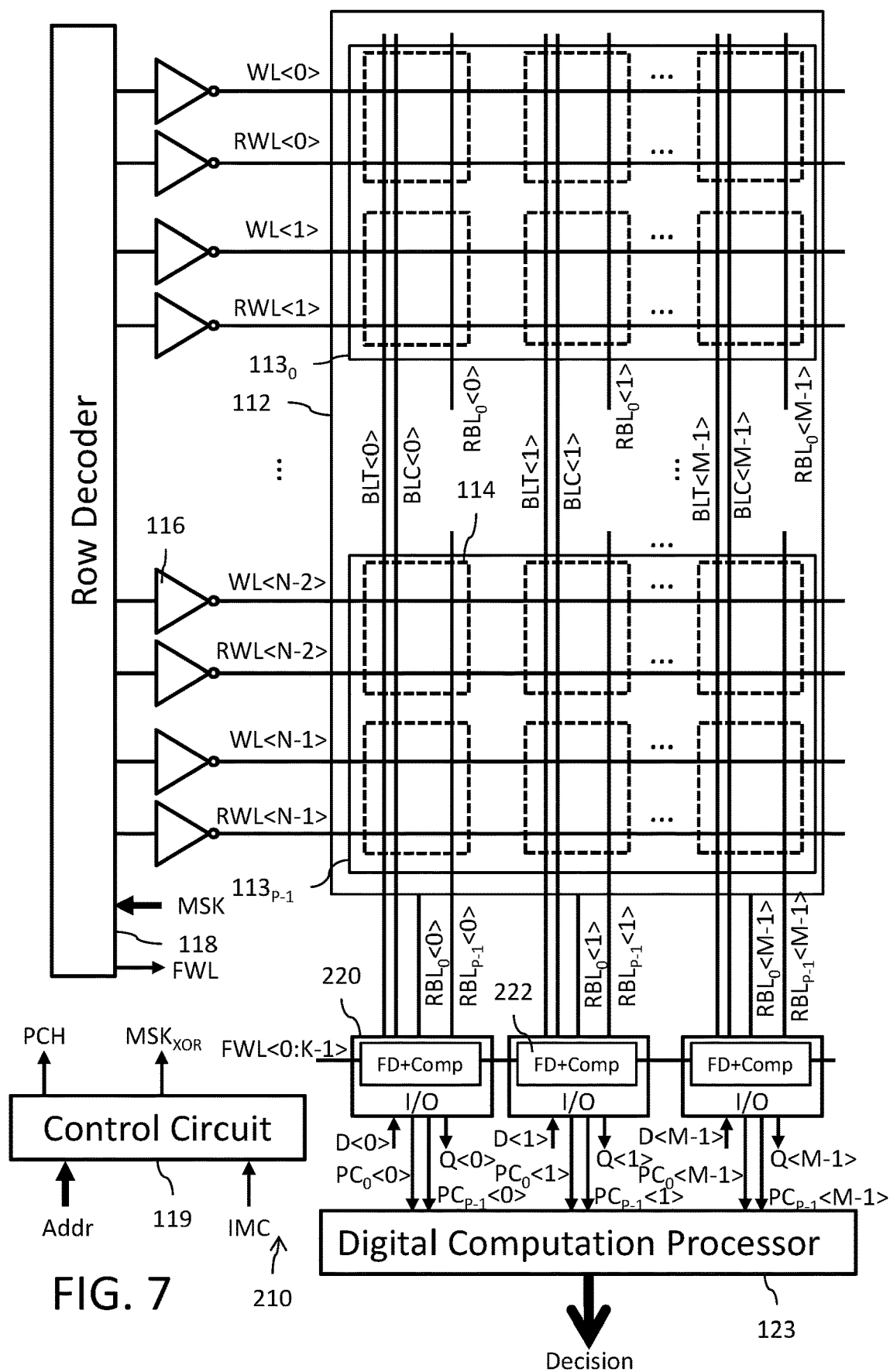
FIG. 7 is a schematic diagram of a circuit supporting both conventional memory access processing and digital in-memory computation processing.

Reference is now made to FIG. 7 which shows a block diagram of a circuit 210 supporting both conventional memory access processing and digital in-memory computation processing. The same references in FIGS. 2 and 7 refer to same or similar components, the description of which will not be repeated. The circuit 210 of FIG. 7 differs from the circuit 110 of FIG. 2 primarily in terms of the handling of the feature data (FD) and the implementation of the column input/output (I/O) circuits 220. In particular, the feature data is stored in the I/O circuits 220, and a digital computation (for example, a Boolean operation such as an XOR operation) is performed within each of the I/O circuits 220 on the output weight data read from the sub-arrays 113$_0$ to 113$_{P-1}$ of the memory on the P local read bit lines RBL$_0$<x> to RBL$_{P-1}$<x> and the stored feature data to generate partial computational output data for output on P partial computation data output ports PC$_0$ to PC$_{P-1}$. Further computation may be performed by the digital computation processing circuit 123 on the partial computational output data to generate a decision output for the digital in-memory compute operation. Again, it will be noted that the processing circuit 123 is an integral part of the circuit 210.

The P local read bit lines RBL$_0$<x> to RBL$_{P-1}$<x> from the sub-arrays 113 for the column x in the array 112 are coupled, along with the common pair of complementary bit lines BLT<x> and BLC<x> for the column x in the array 112, to the column I/O circuit 220(x). Here, x=0 to M−1. A data input port (D) of the column I/O circuit 220 receives input data (user or weight data) to be written to an SRAM memory cell 114 in the column through the pair of complementary bit lines BLT, BLC in response to assertion of a word line signal in a conventional memory access mode of operation. A data output port (Q) of the column I/O circuit 220 generates output data read from an SRAM memory cell 14 in the column through the read bit line RBL in response to assertion of a read word line signal in the conventional memory access mode of operation. Additionally, the column I/O circuit 220 further includes P sub-array data output ports $R_0$ to $R_{P-1}$ to generate computational output data.

Figure 8:
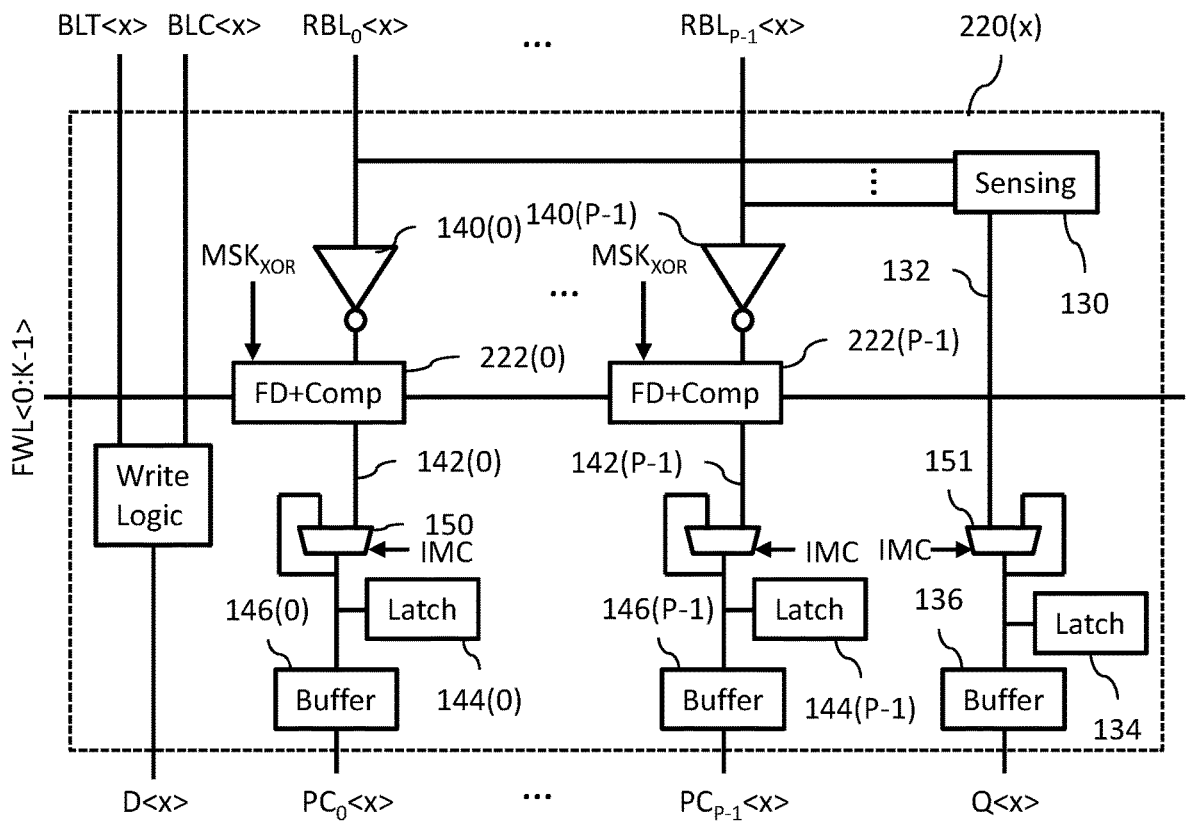
FIG. 8 shows a block diagram for an embodiment of a column I/O circuit for the memory circuit in FIG. 7.

A block diagram of an embodiment for the column I/O circuit 220 is shown in FIG. 8. The column I/O circuit 220(x) is coupled to the pair of complementary bit lines BLT<x>, BLC<x> for the column x in the array 112. The bit at the data input port D<x> is coupled through a write logic circuit to drive the pair of complementary bit lines. The column I/O circuit 220(x) is also coupled to the P local read bit lines $RBL_0$<x> to $RBL_{P-1}$<x> from the sub-arrays 113 for the column x in the array 112 through a read logic circuit. A sensing circuit 130 of the read logic circuit is coupled to receive the data on the P local read bit lines $RBL_0$<x> to $RBL_{P-1}$<x> and generate a sensed data bit on signal line 132. As an example, the sensing circuit 130 may comprise a logic NAND gate. The sensed data bit is applied to the first input of a multiplexer circuit 151 whose select input receives the control signal IMC. The second input of the multiplexer circuit 151 is coupled to the output of the multiplexer circuit 151. The data at the output of multiplexer circuit 151 is latched by latch circuit 134 and buffered by buffer circuit 136 for output at the data output port Q<x>. When the control signal IMC is in the first logic state (for example, logic low—when the circuit 110 is operating in accordance with the conventional memory access mode of operation), the multiplexer circuit 151 selects the data on signal line 132. Conversely, when the control signal IMC is in the second logic state (for example, logic high—when the circuit 110 is operating in accordance with the digital in-memory compute mode of operation), the multiplexer circuit 151 selects the data at the output of the multiplexer circuit 151 (i.e., the data held by the latch 134).

A sensing circuit 140(y) of the read logic circuit is coupled to receive the data on the local read bit line $RBL_y$<x> and generate a sensed data bit on signal line 142(y). Here, y=0 to P−1. As an example, each sensing circuit 140 may comprise a logic NOT gate. The sensed data bit is applied to a feature data buffer and computation (FD+Comp) circuit 222(y). It will be noted that there can be a plurality of these feature data slices which have a certain desired correspondence with the sub-arrays 113 (this correspondence being, for example, a one-to-one correspondence where certain feature data is unique to a certain sub-array or a one-to-many correspondence where certain feature data is applicable to multiple sub-arrays). The FD+Comp circuit 222(y) stores a feature data bit and operates to perform a digital computation (for example, a Boolean operation such as an XOR operation) on the sensed data bit received on signal line 142(y) with the stored feature data bit. A computational output data bit generated as a result of performing the digital computation is applied to the second input of a multiplexer circuit 150 whose select input receives the control signal IMC. The first input of the multiplexer circuit 150 is coupled to the output of the multiplexer circuit 150. The computational output data bit at the output of multiplexer circuit 150 is latched by latch circuit 144(y) and buffered by buffer circuit 146(y) for output at the sub-array data output port $R_y$<x>. When the control signal IMC is in the first logic state (for example, logic low—when the circuit 110 is operating in accordance with the conventional memory access mode of operation), the multiplexer circuit 150 selects the data at the output of the multiplexer circuit 150 (i.e., the data held by the latch 144). Conversely, when the control signal IMC is in the second logic state (for example, logic high—when the circuit 110 is operating in accordance with the digital in-memory compute mode of operation), the multiplexer circuit 150 selects the data on signal line 142.

It will be noted that the FD+Comp circuits 222(y) within a given column I/O circuit 220 may be programmed to store the same bit of feature data. Alternatively, each FD+Comp circuit 222(y) within a given column I/O circuit 220 may be individually programmable and thus capable of storing different bits of feature data. In either case, the bits of the feature data are written into latch circuitry for storage in the FD+Comp circuits 222(y). The writing of feature data bits into each FD+Comp circuit 222(y) is enabled by the assertion of a feature word line signal on a feature word line FWL<0:K−1>. The word line signal on the feature word line FWL may be generated, for example, by the row decoder circuit 118 in connection with generating the word line signal(s) on the word lines WL and/or RWL. Alternatively, the word line signal on the feature word line FWL may be generated by the control circuit 119 in connection with performing the address decoding operation.

The data on the feature word line FWL may have a one-to-many or one-to-one relationship with the sub-arrays 113. Thus, certain feature data on the feature word line FWL<0:K−1> may be applied to the outputs from plural sub-arrays (one-to-many), or certain feature data on the feature word line may be specific to the output from a corresponding certain sub-array (one-to-one).

Figure 9:
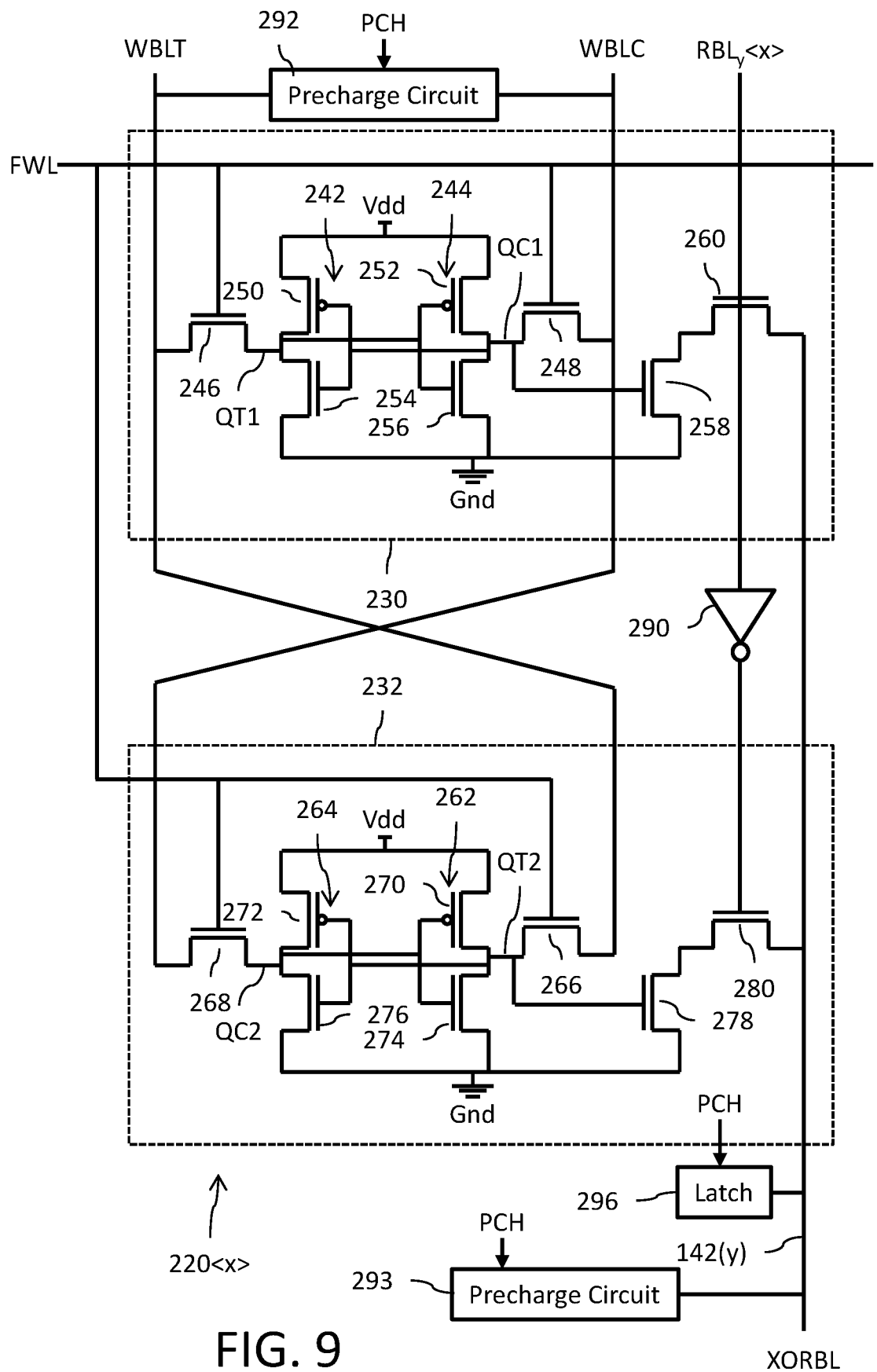
FIG. 9 which shows a circuit diagram for an embodiment of a feature data buffer and computation (FD+Comp) circuit.

Reference is now made to FIG. 9 which shows a circuit diagram for an embodiment of the FD+Comp circuit 222(y). The FD+Comp circuit 222(y) includes a first bit cell 230 and second bit cell 232. The first bit cell 230 includes two cross-coupled CMOS inverters 242 and 244, each inverter including a series connected p-channel and n-channel MOSFET transistor pair. The inputs and outputs of the inverters 242 and 244 are coupled to form a latch circuit having a first true data storage node QT1 and a first complement data storage node QC1 which store complementary logic states of the stored feature data bit. The first bit cell 230 further includes two transfer (passgate) transistors 246 and 248 whose gate terminals are driven by a feature word line FWL. The source-drain path of transistor 246 is connected between the first true data storage node QT1 and a node associated with a true write bit line WBLT. The source-drain path of transistor 248 is connected between the first complement data storage node QC1 and a node associated with a write complement bit line WBLC. The source terminals of the p-channel transistors 250 and 252 in each inverter 242 and 244 are coupled to receive a high supply voltage (for example, Vdd) at a high supply node, while the source terminals of the n-channel transistors 254 and 256 in each inverter 242 and 244 are coupled to receive a low supply voltage (for example, ground (Gnd) reference) at a low supply node. A signal path between an XOR output bit line XORBL (corresponding to signal line 142(y) and the low supply voltage reference is formed by series coupled transistors 258 and 260. The gate terminal of the (read) transistor 258 is coupled to the first complement storage node QC1 and the gate terminal of the (transfer) transistor 260 is coupled to receive the signal on the read bit line $RBL_y$<x>.

The second bit cell 232 includes two cross-coupled CMOS inverters 262 and 264, each inverter including a series connected p-channel and n-channel MOSFET transistor pair. The inputs and outputs of the inverters 262 and 264 are coupled to form a latch circuit having a second true data storage node QT2 and a second complement data storage node QC2 which store complementary logic states of the stored feature data bit. The second bit cell 232 further includes two transfer (passgate) transistors 266 and 268 whose gate terminals are driven by a word line WL. The source-drain path of transistor 266 is connected between the second true data storage node QT2 and a node associated with the true write bit line WBLT. The source-drain path of transistor 268 is connected between the second complement data storage node QC2 and a node associated with the write complement bit line WBLC. The source terminals of the p-channel transistors 270 and 272 in each inverter 262 and 264 are coupled to receive a high supply voltage (for example, Vdd) at a high supply node, while the source terminals of the n-channel transistors 274 and 276 in each inverter 262 and 264 are coupled to receive a low supply voltage (for example, ground (Gnd) reference) at a low supply node. A signal path between the XOR output bit line XORBL (corresponding to signal line 142($y$)) and the low supply voltage reference is formed by series coupled transistors 278 and 280. The gate terminal of the (read) transistor 278 is coupled to the second true storage node QT2 and the gate terminal of the (transfer) transistor 280 is coupled to receive the logical inversion (by way of NOT logic gate 290) of the signal on the read bit line $RBL_y$<x>.

The logical XOR operation is performed within each FD+Comp circuit 222($y$) by the arrangement of transistors 258 and 278 (gate controlled by complementary logic states of the feature data bit stored by the latch circuits in the first and second bit cells 230, 232) and respectively series connected transistors 260 and 280 (gate controlled by complementary logic states of the weight bit read from the array 112 through the read bit line $RBL_y$<x>).

The true write bit line WBLT and the write complement bit line WBLC are coupled to data write circuitry (not explicitly shown) which can write feature data bits to the latch circuits of the first bit cell 230 and the second bit cell 232 when a feature word line signal is asserted on the feature word line FWL.

A bit line precharge circuit 292 is provided to precharge a Vdd voltage level on the true write bit line WBLT and the write complement bit line WBLC in response to a precharge control signal PCH. Likewise, a bit line precharge circuit 293 is provided to precharge a Vdd voltage level on the XOR output bit line XORBL in response to a precharge control signal PCH.

The precharge control signal PCH is further applied to enable a data latching function performed by a latch circuit 296 on the computational output data bit generated on the XOR output bit line XORBL (signal line 142($y$)). In an implementation, the latch circuit 296 may comprise, for example, a D-type flip-flop latch enabled by assertion of the precharge control signal PCH.

Figure 10:
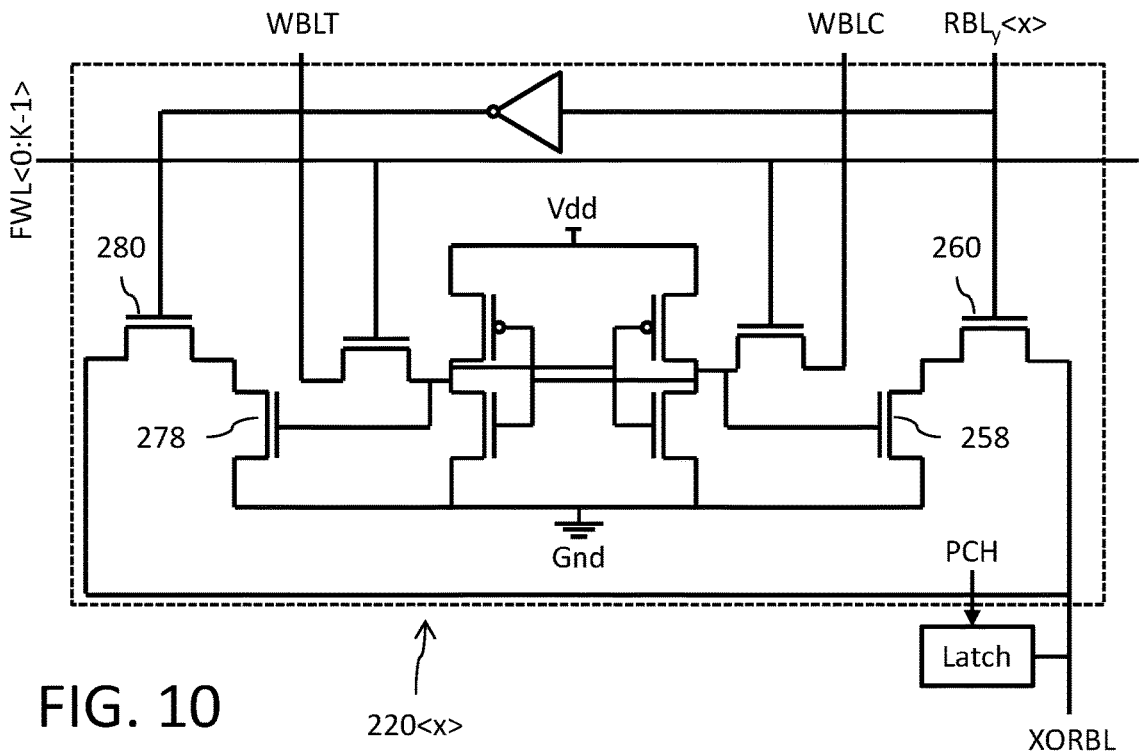
FIG. 10 shows a circuit diagram for another embodiment of the FD+Comp circuit.

FIG. 10 shows a circuit diagram for another embodiment of the FD+Comp circuit 222($y$) which is a logical equivalent of the FIG. 9 circuit. It will be noted here that the circuit utilizes just one latch circuit selectively coupled to the true write bit line WBLT and write complement bit line WBLC in response to assertion of the feature data word line FWL. Similar to the FIG. 9 circuit, the circuit in FIG. 10 includes the arrangement of transistors 258 and 278 (gate controlled by complementary logic states of the feature data bit stored by the latch circuit) and respectively series connected transistors 260 and 280 (gate controlled by complementary logic states of the weight bit read from the array 112 through the read bit line $RBL_y$<x>).

With reference once again to FIG. 8, each FD+Comp circuit 222($y$) may be selectively enabled for performing the computation operation using a computation mask signal $MSK_{XOR}$. The masking functionality may, for example, be implemented by logically ANDing the mask signal bit with a global precharge control signal (i.e., shared across multiple I/O circuits 220), with the logical output of the AND operation providing the local precharge control signal PCH of the FD+Comp circuit 222($y$). When the bit of the computation mask signal $MSK_{XOR}$ is asserted (for example, logic low), this indicates that the computation operation is not enabled for the corresponding FD+Comp circuit 222($y$), and the logic AND gate will block transition of the local precharge control signal PCH in response to transition of the global precharge control signal. Selective masking of the computation operation at the level of each FD+Comp circuit 222($y$) enables a number of benefits including: sparsity management and resolution control. Masking may be employed over a range of granularity including, for example, at the column level (blocking the computation operation by each FD+Comp circuit 222($y$) within a given I/O circuit 220) or at the sub-array data output port R level (blocking the computation operation by a specific FD+Comp circuit 222($y$) within a given I/O circuit 220).

With reference once again to FIG. 7, the digital computation processing circuit 123 can be configured to implement a full adder functionality for adding the XOR computation output bits (i.e., the partial computation output bits) across a plurality of the columns.

Although the circuit design of the FD+Comp circuit 222($y$) shown in FIGS. 9 and 10 is specific for the performance of an XOR computation operation on the sensed data bit received on signal line 142($y$) with the stored feature data bit, it will be understood that this is presented by way of just an example. It is possible to design the FD+Comp circuit 222($y$) used in each I/O circuit 220 to implement any one or more a number of computational operations including Boolean operations for logical XNORing, ANDing, ORing, NANDing, NORing, etc., by suitably arranging and connecting transistors.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
a memory array including a plurality of sub-arrays, wherein each sub-array includes memory cells arranged in a matrix with plural rows and plural columns, each row including a word line connected to the memory cells of the row, and each column including a local bit line connected to the memory cells of the column;
a word line drive circuit for each row having an output connected to drive the word line of the row;
a row decoder circuit coupled to the word line drive circuits;

a control circuit configured to support two modes of memory circuit operation including: a first mode where the row decoder circuit actuates only one word line in the memory array during a memory access operation and a second mode where the row decoder circuit simultaneously actuates one word line per sub-array during an in-memory computation operation;

an input/output circuit for each column comprising:
  a plurality of bit line inputs coupled to the local bit lines of the sub-arrays;
  a column data output coupled to the plurality of bit line inputs and configured to generate a column data bit for output in the first mode;
  a computation circuit configured to store feature data and perform a computational operation as a function of the feature data and a plurality of sub-array data bits present at the plurality of bit line inputs to generate a plurality of partial computation data bits; and
  a plurality of sub-array data outputs coupled to the computation circuit and configured to output the plurality of partial computation data bits in the second mode.

2. The circuit of claim 1, further comprising a processing circuit coupled to the plurality of sub-array data outputs and configured to process the plurality of partial computation data bits.

3. The circuit of claim 1, wherein the computational operation is a Boolean operation.

4. The circuit of claim 3, wherein the Boolean operation is selected from a group consisting of an XOR operation, an XNOR operation, a NAND operation and a NOR operation.

5. The circuit of claim 1, wherein the computational operation is a vector processing operation.

6. The circuit of claim 1, wherein the control circuit is configured to generate a mask signal, and wherein performance of the computation operation for each sub-array data bit is selectively enabled in response to the mask signal.

7. The circuit of claim 1, wherein each memory cell is a static random access memory (SRAM) cell.

8. The circuit of claim 7, wherein the SRAM cell is an 8T-type cell, wherein the word line is a read word line of the 8T-type cell and the local bit line is a read bit line of the 8T-type cell.

9. The circuit of claim 7, wherein the SRAM cell is a 6T-type cell, wherein the word line is a word line of the 6T-type cell and the local bit line is one bit line of a complementary pair of bit lines for the 6T-type cell.

10. The circuit of claim 1, wherein each memory cell is a non-volatile memory cell with a deterministic output.

11. The circuit of claim 1, wherein the input/output circuit for each column further comprises:
  between each bit of the plurality of computation bits and the corresponding sub-array data output, a first latch circuit and a first buffer circuit; and
  a first multiplexing circuit having a first input coupled to receive a bit of the plurality of computation bits, an output coupled to the first latch circuit and the first buffer circuit, and a second input coupled to the output of the first multiplexing circuit;
  wherein a selection input of the first multiplexing circuit is configured to receive a mode control signal, the first multiplexing circuit selecting the second input when the mode control signal is in a first state corresponding to the first mode and selecting the first input when the mode control signal is in a second state corresponding to the second mode.

12. The circuit of claim 11, wherein the input/output circuit for each column further comprises a read circuit coupled between the bit line input and the first input of the first multiplexing circuit.

13. The circuit of claim 11, wherein the input/output circuit for each column further comprises:
  between the plurality of bit line inputs and the column data output, a second latch circuit and a second buffer circuit; and
  a second multiplexing circuit having a first input coupled the plurality of bit line inputs, an output coupled to the second latch circuit and the second buffer circuit, and a second input coupled to the output of the second multiplexing circuit;
  wherein a selection input of the second multiplexing circuit is configured to receive the mode control signal, the second multiplexing circuit selecting the first input when the mode control signal is in the first state corresponding to the first mode and selecting the second input when the mode control signal is in the second state corresponding to the second mode.

14. The circuit of claim 13, wherein the input/output circuit for each column further comprises a read circuit coupled between the plurality of bit line inputs and the first input of the second multiplexing circuit.

15. The circuit of claim 1:
  wherein the row decoder circuit comprises a plurality of sub-decoder circuits corresponding to the plurality of sub-arrays;
  wherein the control circuit is configured to receive an address and includes a predecoder circuit configured to predecode the address and generate decoder control signals for application to the plurality of sub-decoder circuits; and
  wherein each sub-decoder circuit selectively generates a word line signal on a word line in response to said decoder control signals.

16. The circuit of claim 15, wherein in the first mode only one of the plurality of sub-decoder circuits generates one word line signal and wherein in the second mode each of the plurality of sub-decoder circuits generates one word line signal on a word line.

17. The circuit of claim 16, wherein the control circuit is configured to generate a mask signal, and wherein each of the plurality of sub-decoder circuits is selectively enabled for generating the one word line signal in response to the mask signal.

18. The circuit of claim 1:
  wherein the row decoder circuit comprises a plurality of sub-decoder circuits corresponding to the plurality of sub-arrays;
  wherein the control circuit is configured, in the first mode, to receive a first address and includes a first predecoder circuit configured to predecode the first address and generate decoder control signals for application to the plurality of sub-decoder circuits; and
  wherein only one of the plurality of sub-decoder circuits generates one word line signal on a word line in response to said decoder control signals.

19. The circuit of claim 1:
  wherein the row decoder circuit comprises a plurality of sub-decoder circuits corresponding to the plurality of sub-arrays;
  wherein the control circuit is configured, in the second mode, to receive a plurality of second addresses corresponding to the plurality of sub-decoder circuits and includes a second predecoder circuit configured to predecode the plurality of second addresses and generate decoder control signals for application to the plurality of sub-decoder circuits; and wherein each of the plurality of sub-decoder circuits generates one word line signal on a selected word line in response to said decoder control signals.

\* \* \* \* \*